United States Patent
Yorita et al.

(10) Patent No.: US 7,220,370 B2
(45) Date of Patent: *May 22, 2007

(54) PLATING AND PRODUCTION METHODS FOR PRODUCING A FINE METAL COMPONENT USING A CONDUCTIVE PASTE

(75) Inventors: Jun Yorita, Hyogo (JP); Shinji Inazawa, Osaka (JP); Masatoshi Majima, Osaka (JP); Hideki Kashihara, Osaka (JP); Toshihiro Sakamoto, Osaka (JP); Hideaki Toshioka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 364 days.

This patent is subject to a terminal disclaimer.

(21) Appl. No.: 10/487,345

(22) PCT Filed: Aug. 21, 2002

(86) PCT No.: PCT/JP02/08421

§ 371 (c)(1), (2), (4) Date: Feb. 20, 2004

(87) PCT Pub. No.: WO03/019579

PCT Pub. Date: Mar. 6, 2003

(65) Prior Publication Data
US 2004/0232386 A1    Nov. 25, 2004

(30) Foreign Application Priority Data
Aug. 22, 2001 (JP) ............................. 2001-251833

(51) Int. Cl.
*H01B 1/00* (2006.01)
*H01B 1/02* (2006.01)
*H01B 1/12* (2006.01)
*B05D 5/12* (2006.01)
*B05D 7/00* (2006.01)

(52) U.S. Cl. .............. 252/500; 252/521.2; 252/519.33; 427/127; 427/216

(58) Field of Classification Search ................ 252/500, 252/512, 513, 514, 518.1; 427/457; 205/183, 205/187
See application file for complete search history.

(56) References Cited

U.S. PATENT DOCUMENTS 4,923,739 A * 5/1990 Jin et al. ..................... 428/221

(Continued)

FOREIGN PATENT DOCUMENTS

JP    08-273431    * 10/1996

(Continued)

OTHER PUBLICATIONS http://www.minerals.net/resource/property/magnetic.htm.*

(Continued)

*Primary Examiner*—Mark Kopec
*Assistant Examiner*—Jaison Thomas
(74) *Attorney, Agent, or Firm*—McDermott Will & Emery LLP

(57) ABSTRACT

A method of producing a fine metal component where a plated coating is deposited on a conductive film exposed at fine through-hole pattern portions in a mold to produce a fine metal component, wherein the conductive film is made using a conductive paste comprised of a metal powder in which the metal particles are magnetically linked together in a chain shape.

6 Claims, 9 Drawing Sheets

U.S. PATENT DOCUMENTS 5,851,644 A 12/1998 McArdle et al.
6,620,344 B2 * 9/2003 Sano et al. .................. 252/512

FOREIGN PATENT DOCUMENTS

| JP | 8-273431 | | 10/1996 |
|---|---|---|---|
| JP | 09-194768 | | 7/1997 |
| JP | 2000-124662 | * | 4/2000 |
| JP | P2000-124662 A | | 4/2000 |
| JP | 2001-0853397 | * | 3/2001 |
| JP | P2001-85397 A | | 3/2001 |
| JP | 2001-200305 | * | 7/2001 |
| JP | P2001-200305 A | | 7/2001 |
| JP | 2003-147570 | * | 5/2003 |
| JP | P2003-147570 A | | 5/2003 |

OTHER PUBLICATIONS

Taiwan Office Action issued in Corresponding Taiwan Patent Application No. 091133924, dated Jul. 24, 2006.

* cited by examiner

PLATING AND PRODUCTION METHODS FOR PRODUCING A FINE METAL COMPONENT USING A CONDUCTIVE PASTE

TECHNICAL FIELD

The present invention relates to a new conductive paste, a conductive film formed using the conductive paste, a plating method using the conductive paste, and a production method for a fine metal component to which the plating method is applied.

BACKGROUND ART

Conventionally, conductive pastes have been widely used as a material forming a conductive film (a conductive circuit of a printed circuit board, etc.), conductive adhesives used for conductive adhesion between electrical components (mounting of a device or the like on a conductive circuit, connection between conductive circuits, etc.), and so on.

The conductive paste is produced by blending a powdered conductive component, together with a binding agent such as resin and a solvent, in a predetermined ratio. Further, there is a conductive paste from which a solvent is omitted using a liquid binding agent such as liquid curable resin.

Generally employed as the conductive component are metal powders having an average particle diameter of approximately one to several tens of micrometers and having a granular shape, a foil shape (a scale shape, a flake shape), and so on. Examples of metals forming the metal powders include Ag, Cu, Ni, Al, etc.

However, it is difficult because there is a technical limit to make the electrical resistance of a conductive film or a conductive adhesive portion with conductive adhesives (hereinafter generically referred to as a "conductive film") lower than that at the current level using such conventional metal powders.

That is, in the conductive film, a current flows through a lot of metal powders dispersed in the binding agent. Therefore, it is considered that to fill the binding agent with the metal powders with a high density to increase the number of contact points at which the metal powders are directly brought into contact with one another is an effective method of reducing the electrical resistance of the conductive film. Examples of specific methods thereof include one of reducing the particle diameter of each of the metal powders.

In a general production method for metal powders, however, it is not easy to produce metal powders on the order of sub-microns smaller than the above-mentioned range. Moreover, even if the metal powders can be produced, the smaller the particle diameter of each of the fine metal powders becomes, the more easily the metal powders aggregate. Therefore, the metal powders tend to be difficult to uniformly disperse in the binding agent.

Moreover, the respective surfaces of the actual metal powders are covered with an oxide film or the like, and contact resistance is produced by the oxide film or the like at each of contact points there among. The larger the number of contact points becomes, the higher the contact resistance when viewed as the overall film becomes. Therefore, the electrical resistance of the conductive film also tends to be increased.

Therefore, a method of reducing the particle diameter of each of the metal powders to increase the filling density thereof, to reduce the electrical resistance of the conductive film has a technical limitation.

Furthermore, the conventional metal powders have shapes having a low aspect ratio such as a granular shape and a foil shape, as described above. Therefore, the conductivity of the conductive film is approximately equal along both its thickness and its plane. That is, a conductive film having a low anisotropic conductivity can be formed.

Conversely, there is problem that a conductive film cannot be formed superior in such an anisotropic conductivity that the conductivity is high in only the thickness direction, while being low in the other direction, for example.

In recent years, the inventors have given consideration in order to put to practical use a plating method for applying a conductive paste over a base to form a conductive film, then making a plated coating grow on the conductive film by electroplating using the conductive film as an electrode and a production method for a metal component having a fine pattern portion on the order of sub-microns and a thickness of not more than 100 µm (herein after referred to as a "fine metal component") utilizing the plating method.

When the conventional conductive paste is used for the methods, however, the particle sizes of metal grains in the formed plated coating have a distribution discontinuously changed along the thickness of the plated coating. Therefore, it has become clear that a plated coating having a uniform crystal structure cannot be obtained throughout the thickness, so that a fine metal component having good properties cannot be produced.

When further consideration is given to the cause, the following facts are made clear.

That is, the conductive film formed using the conventional conductive paste contains metal powders having an average particle diameter of not less than 1 µm, which is not so small, as compared with the fine metal component, as described above.

When the surface of the conductive film is microscopically viewed at the size level of the fine metal component, therefore, it is not electrically uniform because conductive portions to which the metal powders are exposed and insulation portions there among are in a state where they are distributed in an irregular patch shape in conformity with the sizes of the metal powders.

Moreover, when the surface of the conductive film is similarly microscopically viewed at the size level of the fine metal component, it is not flat because it has irregularities, which are not so small, as compared with the size of the fine metal component, corresponding to the sizes of the metal powders.

The crystal structure of the plated coating by electroplating is liable to be affected by a base. When the plated coating is made to grow using as a base the conductive film whose surface is neither electrically uniform nor flat, as described above, the particle sizes of the grains produced in the plated coating partially in the early stages of coating formation tend to be made significantly larger than the original particle sizes obtained when the plated coating is made to grow on the flat metal surface.

The grains of the same original particle sizes as those in a case where the plated coating is made to grow on the flat metal surface are not produced until the stage in which the growth of the plated coating progresses so that the surface thereof comes closer to a flat metal surface. Thereafter, the plated coating grows in the particle diameter.

Therefore, the plated coating does not have a uniform crystal structure throughout, and has such a distribution that the particle sizes of the metal grains forming the plated coating are discontinuously changed in the thickness direction. Specifically, the plated coating is formed in a two-layered structure comprising an area where the particle sizes of the metal grains forming the plated coating are larger than the original particle sizes and an area where they are equal to the original particle sizes.

Furthermore, in a production method for a fine metal component to which the plating method is applied, a mold composed of an insulating material such as resin having a fine through-hole pattern corresponding to the shape of the fine metal component is made to adhere and fixed on a conductive substrate such as a metal plate with a conductive film composed of a conductive paste intervened between the conductive substrate and the mold, to form a mold for electroforming.

On the surface of the conductive substrate or the conductive film, exposed at a portion of the through-hole pattern, in the mold for electroforming, the plated coating is then made to selectively grow by electroplating using the surface as an electrode, thereby forming a fine metal component corresponding to the shape of the through-hole pattern.

When the mold and the conductive substrate are removed, the fine metal component is obtained.

The conductive film may be formed on the whole surface of the conductive substrate by applying the conductive paste to the whole surface of the conductive substrate to make the mold adhere on the conductive substrate, followed by drying and solidification. In this case, the plated coating is made to grow on the conductive film exposed at the portion of the through-hole pattern of the mold for electroforming, thereby forming the fine metal component.

Furthermore, the conductive film may be formed only in an adhesive portion between the mold and the conductive substrate by applying the conductive paste to a surface, adhering to the conductive substrate, of the mold to make the mold adhere on the conductive substrate, followed by drying and solidification. In this case, the plated coating is made to grow on the conductive substrate exposed at the portion of the through-hole pattern of the mold for electroforming, thereby forming the fine metal component.

In the latter configuration, however, it is difficult to prevent the conductive paste from protruding into the through-hole pattern when the mold is made to adhere on the conductive substrate. Therefore, in a peripheral edge of the through-hole pattern of the mold for electroforming, there occurs a state where the conductive paste protrudes into the through-hole pattern, followed by drying and solidification, so that the conductive film is formed. The plated coating also grows thereon, thereby forming the fine metal component.

In either one of the cases, therefore, the produced fine metal component includes an area, where the particle sizes of the grains are larger than the original ones, as described above, which has grown on the conductive film, thereby making it impossible to obtain desired physical, mechanical or electrical properties when viewed as a whole.

Furthermore, the fine metal component has a two-layered structure comprising an area where the particle sizes of the grains are large and the other area where the particle sizes of the grains are equal to the original ones, and the two areas differ in physical and mechanical properties. Accordingly, the fine metal component is liable to be distorted depending on external conditions such as a temperature change and is liable to be damaged depending on circumstances.

In order to remove the conductive film in the through-hole pattern to expose the conductive substrate, therefore, it is considered that the inside of the through-hole pattern before electroplating is cleaned with a solvent (wet-etched) or dry-etched.

In either processing, however, a mold made of resin is liable to be damaged. Particularly, an edge of the through-hole pattern is rounded, or a side wall of the through-hole pattern is gouged, so that the through-hole pattern is liable to be deformed. Therefore, there arises such a new problem that the shape reproducibility of the fine metal component is lowered.

DISCLOSURE OF THE INVENTION

A primary object of the present invention is to provide a new conductive paste capable of further making the electrical resistance of a conductive film lower than that at the current level.

Another object of the present invention is to provide a new conductive film that can be used in applications which have not been so far considered because it has an anisotropic conductivity.

Still another object of the present invention is to provide a new plating method capable of forming a plated coating having a uniform crystal structure throughout.

A further object of the present invention is to provide a new production method capable of producing a fine metal component having good properties because it has a uniform crystal structure throughout with high shape reproducibility.

A conductive paste according to the present invention is characterized in that a metal powder having the form of fine metal particles being linked in a chain shape is contained as a conductive component.

The chain-shaped metal powder used as the conductive component in the present invention is formed in the form of a lot of fine metal particles on the order of sub-microns being linked in a chain shape by the reduction and deposition method or the like, described later. Accordingly, the contact resistance between the metal particles can be made smaller than before.

Usable as the chain-shaped metal powder is one having a structure in which a metal film is further deposited around a lot of linked metal particles, as also described later. In such a metal powder, the metal particles can be electrically connected to one another by the metal film, thereby making it possible to further reduce the contact resistance therebetween.

Moreover, the specific surface area of the chain-shaped metal powder is larger than that of the conventional metal powders in a granular shape or the like. Accordingly, the metal powders can be uniformly dispersed in the binding agent without aggregating, for example.

If the chain-shaped metal powder is used, therefore, a conductive film identical to one in which granular metal powders on the order of sub-microns, which have been conventionally unfeasible, are dispersed with a high density and uniformly in binding resin without increasing the contact resistance therebetween and aggregating, for example, can be formed by the fine metal particles forming the metal powder.

According to the conductive paste in the present invention, therefore, the electrical resistance of the conductive film can be made infinitely lower than that at the current level.

It is preferable that the chain-shaped metal powder or each of the metal particles forming the metal powder is formed of a metal having paramagnetism, an alloy of two or more types of metals having paramagnetism, an alloy of metal having paramagnetism and other metal, or a complex containing metal having paramagnetism.

Examples of such a metal powder include ones having various structures from one in which a lot of fine metal particles are linked in a chain shape merely by a magnetic force to one in which a metal film is further deposited, as described above, around linked metal particles so that the metal particles are tightly bonded to one another. In either one of them, the metal particles basically hold a magnetic force.

Therefore, the chain is not easily cut even by the degree of a stress created in producing or applying the conductive paste to form the conductive film, for example. Moreover, if the chain is cut, the chain is recombined on the basis of a magnetic force of the metal particles at the time point where no stress is applied, or a plurality of chains are brought into contact with one another so that a conductive network is easily formed.

Consequently, it is possible to further reduce the electrical resistance of the conductive film.

It is preferable that the whole or apart, having a magnetic force, of the chain-shaped metal powder or each of the metal particles is formed by the reduction and deposition method for depositing the metal powder or each of the metal particles in a solution containing one type or two or more types of metal ions including metal ions having paramagnetism by reducing the ions to a metal using a reducing agent in the solution.

When the fine metal particles on the order of sub-microns including the metal having paramagnetism are deposited in the solution by the reduction and deposition method, the metal particles are formed in a single-crystal structure or a structure close thereto. Accordingly, the metal particles are simply polarized into a bipolar phase, and are automatically linked in a chain shape, thereby forming a chain-shaped metal powder.

Therefore, it is easy to produce the chain-shaped metal powder, thereby making it possible to improve the production efficiency of the conductive paste and reduce the cost thereof.

The respective particle diameters of the metal particles formed by the reduction and deposition method are uniform, and the particle size distribution is sharp. Consequently, the chain-shaped metal powder formed by linking a lot of metal particles is superior in the effect of bringing the surface of the conductive film into an electrically uniform state. Accordingly, the conductive paste can be suitably used for a plating method or a production method for a fine metal component, described later.

It is preferable that the reducing agent used for the reduction and deposition method is a trivalent titanium compound.

When the trivalent titanium compound such as titanium trichloride is used as the reducing agent, the solution obtained after the chain-shaped metal powder is formed can be repeatedly regenerated to a state where it can be utilized for producing the chain-shaped metal powder by electrolytic regeneration.

The particle diameter of each of the metal particles may be on the order of sub-microns, as described above. Particularly in a plating method or a production method for a fine metal component, described later, however, it is preferable that the particle diameter of each of the metal particles is not more than 400 nm in order to form a conductive film whose surface is electrically more uniform, and is more flat when microscopically viewed at the size level of the fine metal component. For the same reason, it is preferable that the diameter of the chain of the metal powder is not more than 1 μm.

In a conductive paste respectively containing the chain-shaped metal powder and a binding agent as solid contents, when the content of the chain-shaped metal powder in the total amount of the solid contents is less than 5% by weight, the number of contact points among the metal particles forming the metal powder is reduced, so that the conductivity of the conductive film may be reduced.

Conversely, when the content of the chain-shaped metal powder in the total amount of the solid contents exceeds 95% by weight, the content of the binding agent is relatively insufficient. Accordingly, the effect of binding a lot of metal powders to form a strong conductive film by the binding agent may be insufficient.

Therefore, it is preferable that the content of the chain-shaped metal powder in the total amount of the solid contents in the conductive paste according to the present invention is 5 to 95% by weight.

A conductive film according to the present invention is characterized in that the conductive paste containing the chain-shaped metal powder to which the magnetic force is applied, as described above, is applied over a base to form a coating film, a magnetic field is applied to the coating film before solidifying from a predetermined direction, to orient a chain-shaped metal powder in the coating film in a predetermined direction corresponding to the magnetic field, and the coating film is solidified to fix the orientation of the metal powder.

In the present invention, the orientation of the metal powder dispersed in the coating film can be fixed by solidifying the coating film in a state where the metal powder is oriented, by applying the magnetic field, as described above, in a predetermined direction along its magnetic flux. The conductive film presents such an anisotropic conductivity that the conductivity is specifically high in only the direction in which the chain-shaped metal powder is oriented, while being low in the other direction.

According to the present invention, therefore, a special conductive film whose conductivity is high in the thickness direction, a particular direction having a predetermined angle to the thickness direction, or one direction in its plane, for example, can be formed. Accordingly, the conductive film can be used in applications which have not been so far considered.

A plating method according to the present invention is characterized by comprising the steps of applying the conductive paste according to the present invention over a base to form a conductive film; and making a plated coating grow on the conductive film by electroplating using the conductive film as an electrode.

The conductive film formed using the conductive paste according to the present invention has a high conductivity, as described above.

Moreover, when the surface of the conductive film is microscopically viewed at the size level of the fine metal component, for example, the metal particles, significantly smaller than the fine metal component, constituting the chain-shaped metal powder are almost uniformly dispersed in a state where they are electrically integrally connected to one another through a conductive network by mutual contact among a lot of metal powders. Therefore, the surface of the conductive film is electrically uniform.

Moreover, the surface of the conductive film is nearly flat because it only has significantly smaller irregularities than the fine metal component, corresponding to the sizes of the metal particles.

When the plated coating is made to grow by electroplating on the surface of the conductive film, therefore, the grains of the same original particle sizes as those in a case where it is made to grow on a flat metal surface are produced from the early stages of film formation. Accordingly, the plated coating having a uniform crystal structure throughout can be formed.

It is preferable that the volume resistivity of the conductive film used for the plating method according to the present invention is not more than 1 Ω·cm.

When the volume resistivity of the conductive film is within the above-mentioned range, the loss of energy such as heat generation can be reduced by reducing the electrical resistance at the time of electroplating.

Furthermore, it is preferable that in the conductive paste used for the plating method according to the present invention, the chain-shaped metal powder contains at least one type of metal which is the same as that contained in the plated coating.

According to the configuration, the plated coating can be continuously subjected to crystal growth from the surface of the chain-shaped metal powder exposed to the surface of the conductive film. Therefore, it is easier to control the particle sizes of the grains in the plated coating to the original ones.

A production method for a fine metal component according to the present invention is characterized by comprising the steps of:

fixing a mold composed of an insulating material having a fine through-hole pattern corresponding to the shape of the fine metal component on a conductive substrate with a conductive film composed of a conductive paste intervened between the conductive substrate and the mold according to the present invention, to form a mold for electroforming; and making a plated coating selectively grow on a surface of the conductive substrate or the conductive film exposed at a portion of the through-hole pattern of the mold for electroforming by electroplating using the surface as an electrode, to form a fine metal product corresponding to the shape of the through-hole pattern.

As described in the foregoing, the plated coating formed by electroplating on the surface of the conductive film formed using the conductive paste according to the present invention has the same uniform crystal structure as that directly formed on the surface of a conductive substrate made of metal throughout depending on the properties of the chain-shaped metal powder.

In either one of a case where the plated coating is made to grow on the surface of the conductive film exposed at the portion of the through-hole pattern of the mold for electroforming and a case where the plated coating is made to grow on the surface of the conductive substrate exposed at the portion of the through-hole pattern of the mold for electroforming and the surface of the conductive film which has protruded thereinto, therefore, a fine metal component having good properties having a single layered structure in which desired physical, mechanical, and electrical properties can be exhibited because the grains are of the original particle sizes.

Therefore, the step of removing the conductive film to expose the conductive substrate, which may damage the mold made of resin is not required, thereby making it possible to also produce the fine metal component faithfully to the shape of the mold with high reproducibility.

In the conductive paste, respectively containing the chain-shaped metal powder and the binding agent as solid contents, used for the above-mentioned production method, when the content of the chain-shaped metal powder in the total amount of the solid contents exceeds 20% by volume, the content of the binding agent is relatively reduced. Accordingly, the adhesive strength of the conductive paste is lowered, so that the conductive substrate and the mold which are made of different types of materials may not be firmly fixable.

Contrary to this, if the content of the chain-shaped metal powder is not more than 20% by volume, the adhesive strength of the conductive paste is improved, thereby making it possible to more firmly fix the conductive substrate and the mold. Moreover, the conductive film formed using the conductive paste can be maintained in a state where the resistance is lower and the conductivity is higher, as compared with those in a case where the same amount of metal powder having another shape such as a granular shape is used, depending on the properties of the chain-shaped metal powder, described above. Therefore, it is possible to produce a fine metal component having good properties, as described above.

In a case where the content is less than 0.05% by volume, the number of contact points among the metal particles forming the metal powder is significantly reduced irrespective of the fact that the chain-shaped metal powder is used. Accordingly, the conductivity of the conductive film is greatly lowered, so that a fine metal component having good properties may not be producible.

It is preferable that the content of the chain-shaped metal powder in the total amount of the solid contents in the conductive paste used for producing the fine metal component is 0.05 to 20% by volume.

The conductive film formed using the conductive paste containing the above-mentioned percentage by volume of the chain-shaped metal powder has a significantly high conductivity by itself depending on the properties of the chain-shaped metal powder, as described above.

However, the smaller the content is in the above-mentioned range, the more conductive portions to which the chain-shaped metal powder is exposed are liable to enter a state where they are distributed in a so-called sea-island structure in an insulated portion composed of the binding agent when the surface of the conductive film is microscopically viewed at the level of the fine metal component. Particularly, there occurs a case where the distribution density of power feeding points at the start of electroplating is insufficient.

In such a case, it is preferable that used as the conductive paste is one containing the chain-shaped metal powder as well as a granular metal powder having a smaller particle diameter than the chain-shaped metal powder.

In such a configuration, it is possible to fill a portion between the conductive portions formed by the chain-shaped metal powder of the conductive film with a granular metal powder to increase the distribution density of the power feeding points at the start of electroplating. Therefore, a fine metal component having better properties can be produced.

It is preferable that in the conductive paste, the content of the chain-shaped metal powder in the total amount of the solid contents is 0.05 to 20% by volume for the same reason as described above.

In a case where the content of the granular metal powder is less than 0.05% by volume, the effect of filling the portion between the conductive portions formed by the metal powder of the conductive film with the metal powder to increase the distribution density of the power feeding points at the start of electroplating may be insufficient.

Therefore, the higher the content of the granular metal powder is, the more preferable it is when consideration is given to the effect of filling the portion between the conductive portions to increase the distribution density of the power feeding points at the start of electroplating.

When the content of the granular metal powder exceeds 20% by volume because the chain-shaped metal powder and the granular metal powder are mixed in the conductive film, however, the content of the binding agent is made relatively too low. Therefore, the adhesive strength of the conductive paste is lowered, and the strength of the conductive film itself is lowered, so that the conductive substrate and the mold may not be firmly fixable.

Consequently, it is preferable that the content of the granular metal powder in the total amount of the solid contents is 0.05 to 20% by volume.

Another production method for a fine metal component according to the present invention is characterized by comprising the steps of:

forming on a conductive substrate a first conductive film composed of the conductive paste according to the present invention and a second conductive film composed of a conductive paste containing a metal powder having a smaller particle diameter than a chain-shaped metal powder contained in the first conductive film in this order, and fixing a mold composed of an insulating material having a fine through-hole pattern corresponding to the shape of the fine metal component on a conductive substrate with both the conductive films intervened between the conductive substrate and the mold, to form a mold for electroforming; and making a plated coating selectively grow on a surface of the second conductive film exposed at a portion of the through-hole pattern of the mold for electroforming by electroplating using the surface as an electrode, to form a fine metal component corresponding to the shape of the through-hole pattern.

According to the present invention, it is possible to fill a portion between conductive portions distributed in an island shape of the first conductive film with the metal powder in the second conductive film to increase the distribution density of power feeding points at the start of electroplating in the same manner as described above, thereby making it possible to produce a fine metal component having better properties.

When the content of the metal powder in the total amount of the solid contents in the conductive paste which is the original form of the second conductive film is less than 0.05% by volume, the effect of filling the portion between the conductive portions of the first conductive film, described above, with the metal powder having a small particle diameter to increase the distribution density of the power feeding points at the start of electroplating may be insufficient.

The higher the content of the metal powder in the conductive paste which is the original form of the second conductive film is, the more preferable it is when consideration is given to the effect of filling the portion between the conductive portions to increase the distribution density of the power feeding points at the start of electroplating. Further, the conductive paste may be one that makes the first conductive film and the mold both composed of the same type of material such as resin adhere to each other. Accordingly, the content of the binding agent can be made significantly lower than that in the case of the first conductive film.

When the content of the metal powder exceeds 70% by volume, however, the content of the binding agent becomes relatively too low. Accordingly, the adhesive strength of the conductive paste is lowered, and the strength of the second conductive film itself is lowered, so that the first conductive film and the mold may not be firmly fixable.

Consequently, it is preferable that the content of the metal powder in the total amount of the solid contents in the conductive paste forming the second conductive film is 0.05 to 70% by volume.

The [0015] column of Japanese Laid Opened Patent Publication No. JP-2001-200305-A2 discloses that fine particles of an alloy having paramagnetism having an average particle diameter of approximately 50 nm may be linked in a chain shape to form secondary particles.

However, the gazette aims at providing an electromagnetic wave shielding material, and the electromagnetic wave shielding material must have insulating properties, as is well-known. Therefore, the idea of positively utilizing secondary particles linked in a chain shape, as described above, for positively improving the conductivity is not included at all in the gazette.

As its proof, the above-mentioned gazette discloses that the fine particles of the alloy, together with synthetic resin, are kneaded and used as a material for injection molding to form the electromagnetic wave shielding material, and the fine particles of the alloy are mixed with sol-gel ceramics or the like to be used as a slurry for spray molding for an electromagnetic wave shield.

In the molding methods, a greater stress which is not comparable to that in a case where the fine particles of the alloy are used as a paste is applied. Accordingly, the fine particles of the alloy cannot maintain the shape of the secondary particles linked in a chain shape, and are dispersed in the electromagnetic wave shield in a state where they are broken and scattered for each of the fine particles of the alloy which are suitable for the electromagnetic wave shield.

Therefore, the description of the above-mentioned gazette neither discloses nor suggests the present invention.

Furthermore, Japanese Laid Opened Patent Publication No. JP-H08-273431-A2 discloses a conductive paste using dendrite grains as a conductive component. However, the "dendrite grains" herein referred to are a solid metal powder having an aspect ratio of not more than 10, and are only one deformation of the metal powder in a granular shape or the like described in the prior art of the present invention.

Therefore, the description of the above-mentioned gazette neither discloses nor suggests the present invention.

BEST MODE FOR CARRYING OUT THE INVENTION

The present invention will be described.

<Conductive Paste>

A conductive paste according to the present invention is characterized in that it contains a metal powder having the form of a lot of fine metal particles being linked in a chain shape as a conductive component, as described above.

(Metal Powder)

Usable as the chain-shaped metal powder is any type of metal powders respectively produced by various types of methods such as a vapor phase method and a liquid phase method and having various chain structures such as a straight-chain structure and a branched-chain structure.

It is preferable that the particle diameter of each of the metal particles forming the chain-shaped metal powder is on the order of sub-microns, and particularly not more than 400 nm. Further, it is preferable that the diameter of the chain is not more than 1 μm. The reasons for these are as previously described.

It is more preferable that the particle diameter of each of the metal particles is particularly not more than 200 nm in the above-mentioned range, considering that a conductive film which is electrically uniform and is flat is formed. When the particle diameter is too small, however, the size of the metal powder itself formed of the metal particles being linked in a chain shape is too small, so that the function of the metal powder as a conductive component may not be sufficiently obtained. Consequently, it is preferable that the particle diameter of each of the metal particles is not less than 10 nm.

It is more preferable that the diameter of the chain is particularly not more than 400 nm in the above-mentioned range, also considering that a conductive film which is electrically uniform and is flat is formed. When the diameter of the chain is too small, however, the chain may be easily cut even by the degree of a stress created in producing or applying the conductive paste. Consequently, it is preferable that the diameter of the chain is not less than 10 nm.

It is preferable that as the above-mentioned chain-shaped metal powder, the metal powder or each of the metal particles forming the metal powder is formed of a metal having paramagnetism, an alloy of two or more types of metals having paramagnetism, an alloy of metal having paramagnetism and other metal, or a complex containing metal having paramagnetism. The reason for this is as previously described.

Specific examples of the metal powder containing the metal having paramagnetism include any one of the following types of metal powders (a) to (f) or a mixture of two or more types of metal powders.

Figure 1A:
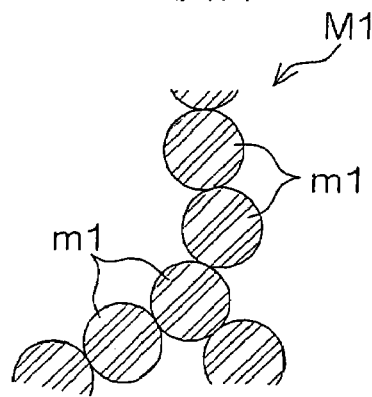
FIGS. 1A to 1F are cross-sectional views each showing an example of a chain-shaped metal powder contained as a conductive component in a conductive paste according to the present invention in partially enlarged fashion.

(a) A metal powder M1 obtained by linking a lot of metal particles m1 on the order of sub-microns, formed of a metal having paramagnetism, an alloy of two or more types of metals having paramagnetism, or an alloy of metal having paramagnetism and other metal, in a chain shape by its own magnetism, as illustrated in partially enlarged fashion in FIG. 1A.

Figure 1B:
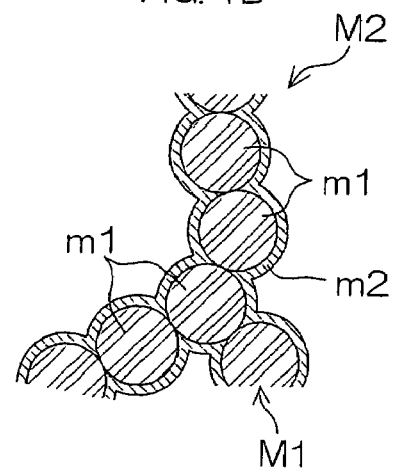

(b) A metal powder M2 obtained by further depositing a metal layer m2 composed of a metal having paramagnetism, an alloy of two or more types of metals having paramagnetism, or an alloy of metal having paramagnetism and other metal on the surface of the metal powder M1 in the foregoing item (a), to tightly bond the metal particles to one another, as illustrated in partially enlarged fashion in FIG. 1B.

Figure 1C:
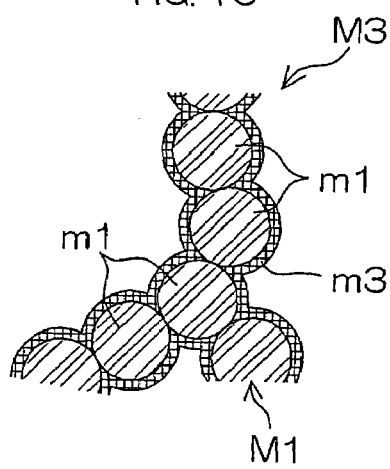

(c) A metal powder M3 obtained by further depositing a metal layer m3 composed of another metal such as Ag, Cu, Al, Au, or Rh or an alloy on the surface of the metal powder M1 in the foregoing item (a), to tightly bond the metal particles to one another, as illustrated in partially enlarged fashion in FIG. 1C.

Figure 1D:
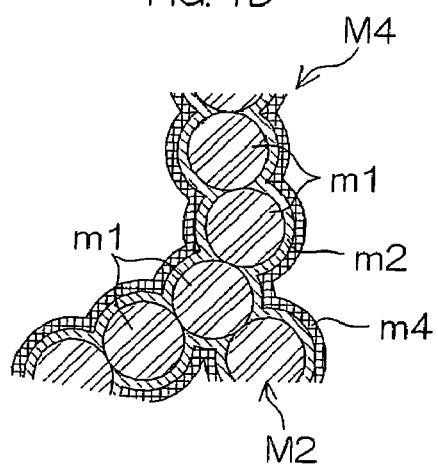

(d) A metal powder M4 obtained by further depositing a metal layer m4 composed of another metal such as Ag, Cu, Al, Au, or Rh or an alloy on the surface of the metal powder M2 in the foregoing item (b), to tightly bond the metal particles to one another, as illustrated in partially enlarged fashion in FIG. 1D.

Figure 1E:
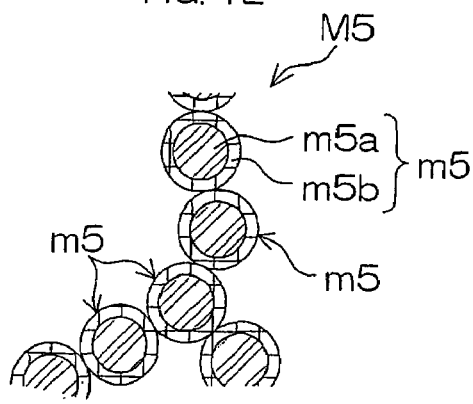

(e) A metal powder M5 obtained by coating the surface of a granular core material m5$a$ formed of a metal having paramagnetism, an alloy of two or more types of metals having paramagnetism, or an alloy of metal having paramagnetism and other metal with a coating layer m5$b$ composed of other metal such as Ag, Cu, Al, Au, or Rh or an alloy to obtain a complex m5, and linking a lot of complexes m5 in a chain shape as metal particles by the magnetism of the core material m5$a$, as illustrated in partially enlarged fashion in FIG. 1E.

Figure 1F:
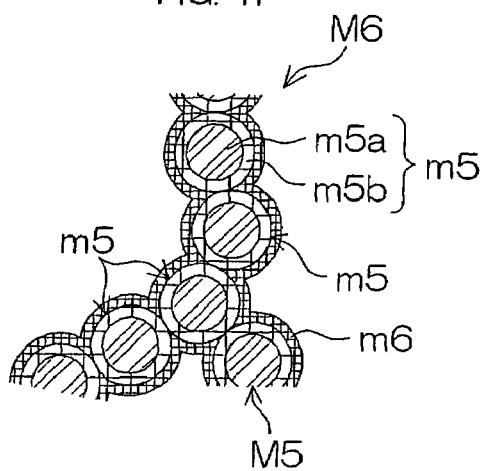

(f) A metal powder M6 obtained by further depositing a metal layer m6 composed of another metal such as Ag, Cu, Al, Au, or Rh or an alloy on the surface of the metal powder M5 in the foregoing item (e), to tightly bond the metal particles to one another, as illustrated in partially enlarged fashion in FIG. 1F.

Although in the drawings, the metal layers m2, m3, m4, and m6 and the coating layer m5$b$ are respectively described as single layers, each of the layers may have a laminated structure of two or more layers composed of the same metal material or different metal materials.

Furthermore, it is preferable that the whole of the metal powder or each of the metal particles formed of a metal having paramagnetism, an alloy of two or more types of metals having paramagnetism, or an alloy of metal having paramagnetism and other metal out of the foregoing metal powders, or a portion containing metal having paramagnetism of the metal powder or each of the metal particles formed of a complex containing the metal having paramagnetism is formed by being deposited in a solution containing ions forming metal having paramagnetism which is its forming material by adding a reducing agent to the solution by the reduction and deposition method, as described above.

In the reduction and deposition method, ammonia water or the like is added to a solution in which a trivalent titanium compound such as titanium trichloride as a reducing agent and sodium citrate or the like are dissolved (hereinafter referred to as a "reducing agent solution") to adjust the pH thereof to 9 to 10. Consequently, trivalent titanium ions are bonded to a citric acid serving as a complexing agent to form a coordination compound, so that activation energy in the case of oxidation from Ti(III) to Ti(IV) is lowered, and a reduction potential is raised. Specifically, a potential difference between Ti(III) and Ti(IV) exceeds 1V. This value is a significantly higher value, as compared with a reduction potential from Ni(II) to Ni(0) and a reduction potential from Fe(II) to Fe(0). Accordingly, it is possible to efficiently reduce ions forming various types of metals, to deposit and form metal particles, metal films, and so on.

A solution containing ions forming a metal having paramagnetism such as Ni or a solution containing two or more types of ions forming an alloy containing a metal having paramagnetism is then added to the above-mentioned reducing agent solution.

Consequently, Ti(III) functions as a reducing agent, to reduce metal ions and deposit the reduced metal ions in the solution when itself is oxidized to Ti(IV). That is, metal particles composed of the above-mentioned metal or alloy are deposited in the solution, and a lot of metal particles are linked in a chain shape by their own magnetism, to form a chain-shaped metal powder. When the deposition is further continued after that, a metal layer is further deposited on the surface of the metal powder, thereby tightly bonding the metal particles.

That is, the metal powders M1 and M2 in the foregoing items (a) and (b) and the metal particles m1 which are the original form of the metal powders, the core materials m5$a$ in the complexes m5 which are the original form of the metal powders M5 and M6 in the foregoing items (e) and (f), or the like are produced by the above-mentioned method.

Furthermore, the respective particle diameters of the metal particles m1 or the core materials m5$a$ are uniform, and the particle size distribution is sharp. The reason for this is that reduction reaction uniformly progresses in the reaction system. Consequently, any of the metal powders M1 to M6 produced from the metal particles m1 or the core materials m5$a$ is superior in the effect of bringing the surface of the conductive film into an electrically uniform state, and can be suitably employed for a plating method and a production method for a fine metal component.

The reducing agent solution obtained after the metal particles, the core materials, or the like are deposited can be utilized for producing the chain-shaped metal powder by the reduction and deposition method repeatedly any number of times by performing electrolytic regeneration, as described above. That is, if the reducing agent solution obtained after the metal particles, the core materials, or the like are deposited is put in an electrolytic cell, for example, to reduce Ti(IV) to Ti(III) by applying a voltage, it can be employed as a reducing agent solution for electrolytic deposition. This is because titanium ions are hardly consumed at the time of electrolytic deposition, that is, titanium ions, together with a metal to be deposited, are not deposited.

Examples of a metal or an alloy having paramagnetism forming the metal particles, the core materials, or the like include metals Ni, Fe, and Co, an alloy of two or more types of ones of the metals, for example. Particularly, Ni, a Ni—Fe alloy (Permalloy), and so on are suitably employed. Particularly metal particles formed of such a metal or alloy are strong in magnetic interaction in a case where they are linked in a chain shape and therefore, are superior in the effect of reducing contact resistance between the metal particles.

Examples of other metals, together with the metal or alloy having paramagnetism, forming the complexes in the foregoing items (c), (d), (e), and (f) include Ag, Cu, Al, Au, and Rh. Particularly Ag is suitably used because the conductivity thereof is high.

A portion formed of the other metal, described above, in the complex can be formed by various types of film forming methods such as an electroless plating method, an electrolytic plating method, a reduction and deposition method, and a vacuum evaporation method.

(Binding Agent)

Usable as a binding agent, together with the chain-shaped metal powder, forming the conductive paste is any of various types of compounds conventionally known as a binding agent for a conductive paste. Examples of such a binding agent include thermoplastic resin, curable resin, and liquid curable resin. Particularly preferable examples include acrylic resin, fluorocarbon resin, and phenolic resin.

(Conductive Paste)

The conductive paste is produced by blending the chain-shaped metal powder and the binding agent, together with a suitable solvent, in a predetermined ratio. Further, the solvent may be omitted using a liquid binding agent such as liquid curable resin, as described above.

Although the ratio of the foregoing components is not particularly limited, the ratio of the chain-shaped metal powder in the total amount of solid contents, i.e., the metal powder and the binding agent is preferably 5 to 95% by weight. The reason for this is as described above.

The conductive paste makes it possible to form a conductive film or the like having a conductivity higher than before depending on the properties of the chain-shaped metal powder, as described above.

That is, when the ratio of the chain-shaped metal powder is set to not less than 50% by weight which is the same as that of a normal conductive paste in the foregoing range, a conductive film or the like having a higher conductivity, which cannot be so for obtained, having a volume resistivity of not more than 1 Ω·cm can be formed.

In this case, the more suitable range of the ratio of the chain-shaped metal powder is 50 to 90% by weight, and the volume resistivity of a conductive film formed in this case is approximately $1 \times 10^{-4}$~1 Ω·cm.

The conductive paste according to the present invention makes it possible to also form a conductive film or the like having approximately the same conductivity as the conventional one by making the ratio of the chain-shaped metal powder lower than before depending on the properties thereof.

That is, even if the ratio of the chain-shaped metal powder is set to less than 50% by weight, a conductive film or the like having approximately the same conductivity as the conventional one can be formed depending on the properties of the chain-shaped metal powder, thereby making it possible to achieve resource saving and cost reduction.

The more suitable range of the ratio of the chain-shaped metal powder in this case is not less than 30% by weight and less than 50% by weight, and the volume resistivity of a conductive film formed in this case is not more than nearly 100 Ω·cm, although it exceeds 1 Ω·cm.

<Conductive Film>

In order to form the conductive film according to the present invention in which the orientation of the chain-shaped metal powder is controlled, as described above, a conductive paste using as the chain-shaped metal powder a metal powder containing a metal having paramagnetism is applied over a base to form a coating film.

By then applying a magnetic field to the coating film before solidifying from a predetermined direction, the chain-shaped metal powder in the film is oriented in a predetermined direction corresponding to the magnetic field. That is, the chain-shaped metal powder is oriented, when the magnetic field is applied thereto, in the direction of its magnetic flux.

When the coating film is dried, solidified, or cured when it contains curable resin, to fix the metal powder in this state, a conductive film having such an anisotropic conductivity that the conductivity is specifically high in only the direction in which the chain-shaped metal powder is oriented, while being low in the other direction is formed.

A conductive film having a high conductivity in only one direction in its plane, for example, can be suitably used as an electrode in a plating method and a production method for a fine metal component, subsequently described.

A conductive film having a high conductivity in only the other direction may be usable in various types of applications which have not been so for considered.

It is preferable that the strength of the magnetic field applied to the coating film in order to orient the chain-shaped metal powder is not less than nearly 7.9 A/m. In a case where the strength of the magnetic field is less than this range, the orientation of the chain-shaped metal powder maybe insufficient.

<Plating Method>

In a plating method according to the present invention, a conductive paste containing a chain-shaped metal powder is applied to a base to form a conductive film, followed by electroplating using the conductive film as an electrode. That is, the conductive film as a cathode and a metal to be plated or platinum or the like as an anode are dipped in an electroplating bath, followed by application of a voltage, thereby making it possible to from a plated coating having a uniform crystal structure throughout its thickness, as described above.

In this case, it is preferable that the volume resistivity of the conductive film is adjusted to not more than 1 Ω·cm. The reason for this is as previously described. In order to adjust the volume resistivity of the conductive film in the above-mentioned range, the ratio of the chain-shaped metal powder to the total amount of the solid contents in the conductive paste may be increased.

It is preferable that used as the chain-shaped metal powder in the conductive paste is one containing at least one type of metal which is the same as that contained in the plated coating. The reason for this is as previously described.

Furthermore, a method of orienting the chain-shaped metal powder in only one direction in the plane of the conductive film, as described in the previous section, is effective. In this method, the volume resistivity in the same direction of the conductive film can be adjusted in the above-mentioned range without increasing the ratio of the chain-shaped metal powder. A conductive terminal for connection to a power supply is attached to a portion at an end in the direction of the orientation of the conductive film, for example, thereby making it possible to perform good plating having no loss of energy.

If both the methods are combined with each other, the volume resistivity of the conductive film can be further reduced. When the ratio of the chain-shaped metal powder is set to not less than 50% by weight, and the chain-shaped metal powder is oriented in only one direction in its plane, the volume resistivity in the same direction of the conductive film can be also set to less than $1 \times 10^{-4}$ Ω·cm.

The lower limit of the volume resistivity of the conductive film is not particularly limited. The lower limit can be employed without problems until a limit value feasible by the methods described above.

<Production Method (i) for Fine Metal Component>

Figure 2A:
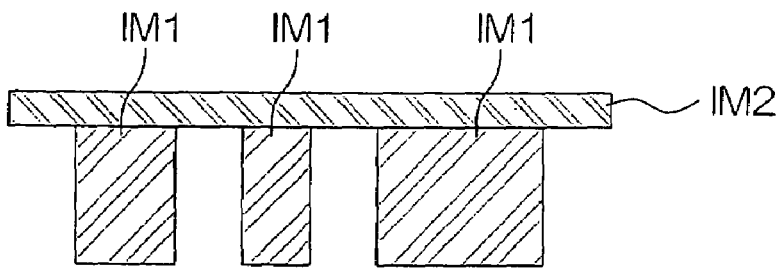
FIGS. 2A to 2D are cross-sectional views showing an example of the steps of forming a mold composed of an insulating material used in a production method for a fine metal component according to the present invention.
Figure 2B:
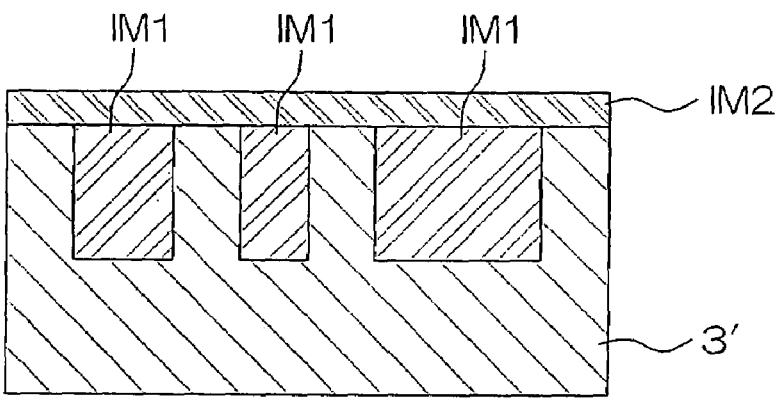
Figure 2C:
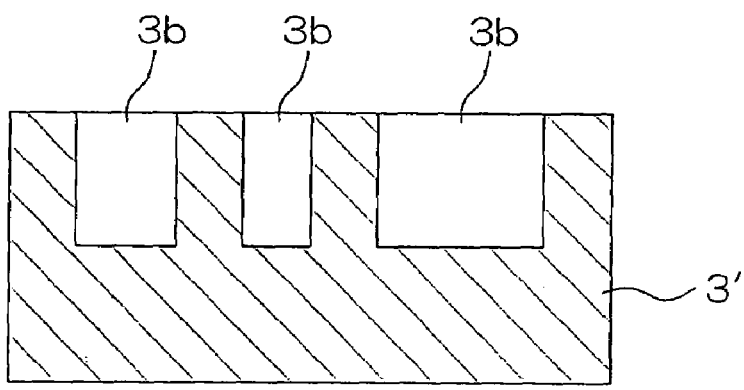
Figure 2D:
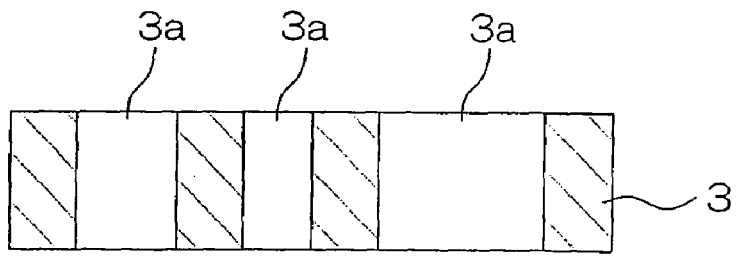

In a production method (i) for a fine metal component, a mold 3 composed of an insulating material having a fine through-hole pattern 3a corresponding to the shape of the fine metal component is formed, as shown in FIG. 2D.

Although the mold 3 can be formed by various types of methods, it is preferably formed particularly by injection molding, reactive injection molding, or the like using a mother die produced by lithography and electroplating. Further, suitably employed as the lithography is X-ray lithography for irradiating X-rays such as SR (Synchrotron Radiation) light onto a resist and forming a fine pattern by development after the irradiation.

Specifically, after a mother die IM1 which is the original form of the fine metal component is formed on a conductive substrate IM2, as shown in FIG. 2A, utilizing X-ray lithography and electroplating, a precursor 3' of the mold 3 having a fine recess 3b which is the original form of the through-hole pattern 3a corresponding to the shape of the mother die IM1 is obtained by injection molding or reactive injection molding (FIGS. 2B and 2C).

When the precursor 3' is polished to penetrate through the recess 3b, the mold 3 having the through-hole pattern 3a corresponding to the shape of the mother die IM1 is formed, as shown in FIG. 2D.

According to the method, the molds 3 can be formed in large numbers using one mother die IM1 any number of times. As a result, the production cost of the fine metal component can be made significantly lower than before.

Figure 3A:
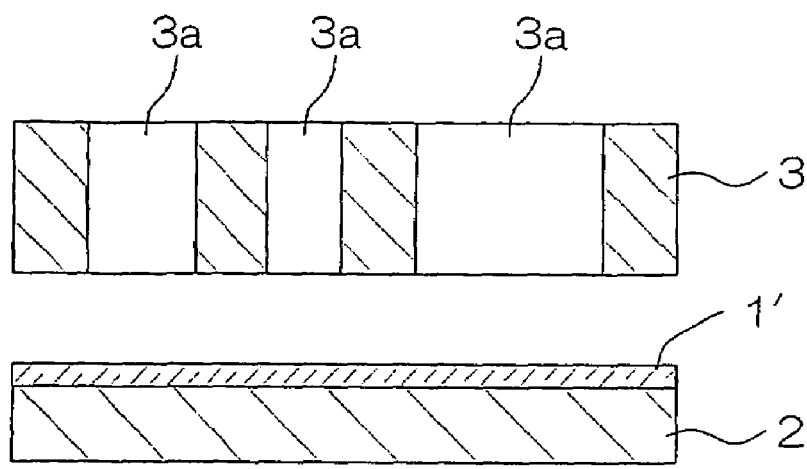
FIGS. 3A and 3B are cross-sectional views showing an example of the steps of forming a mold for electroforming using the above-mentioned mold.
Figure 3B:
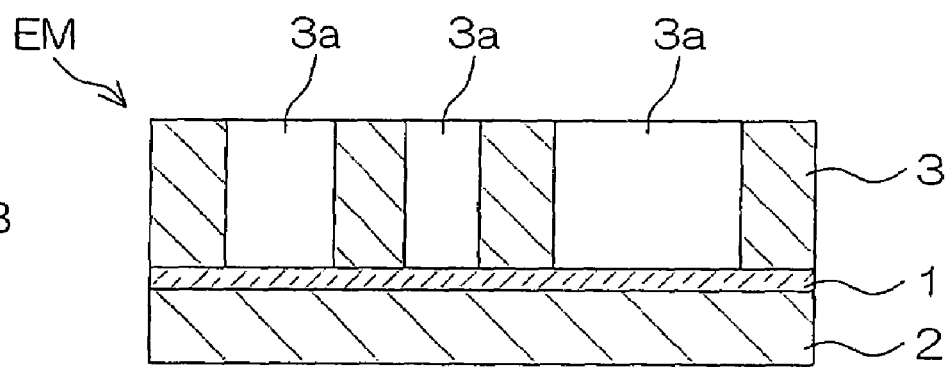

In the present invention, a conductive paste 1' is then applied over the whole surface of a conductive substrate 2 such as a metal plate, and the mold 3 is then superimposed thereon, as shown in FIGS. 3A and 3B. A conductive film 1 is formed by drying the conductive paste 1', and curing, when a binding agent is curable resin, the binding agent, and the mold 3 is fixed on the conductive substrate 2, thereby manufacturing a mold for electroforming EM.

Figure 4A:
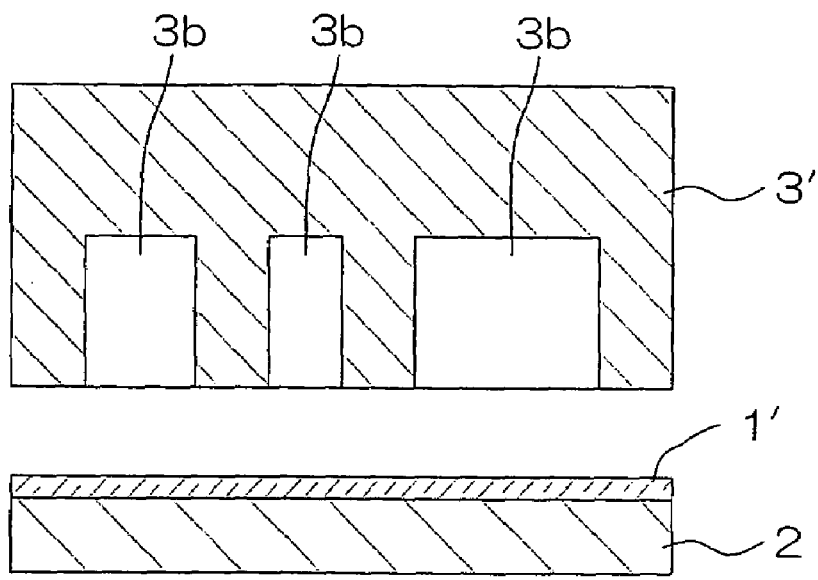
FIGS. 4A to 4C are cross-sectional views showing another example of the steps of forming a mold for electroforming using the above-mentioned mold.
Figure 4B:
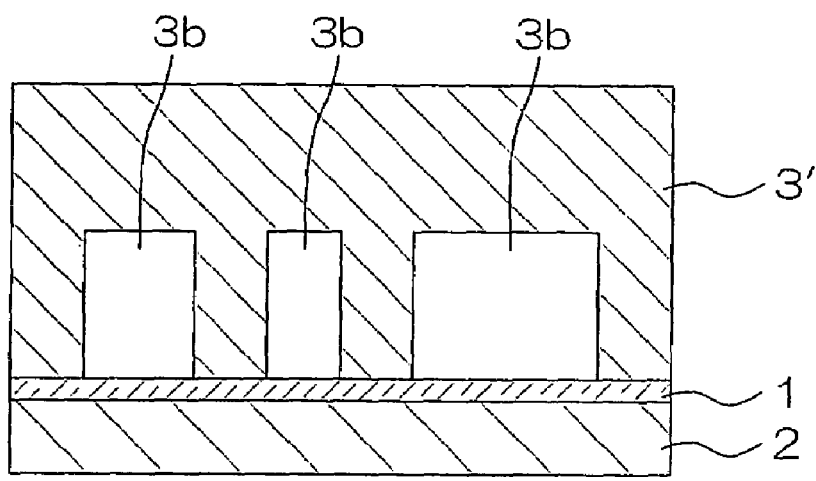
Figure 4C:
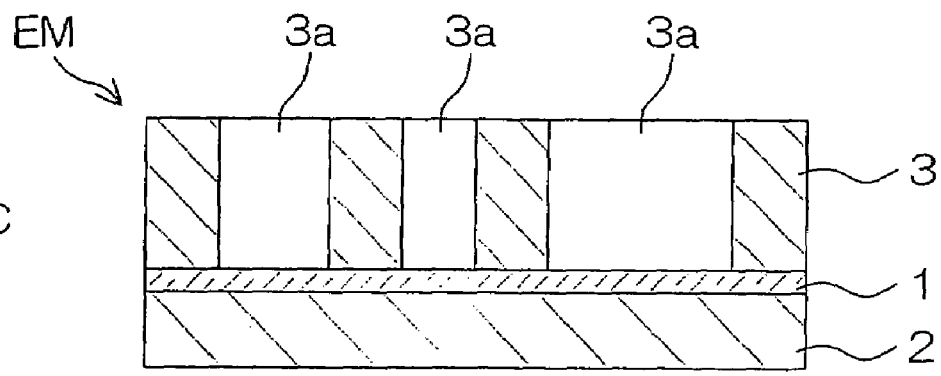

Alternatively, a conductive paste 1' is applied over the whole surface of a conductive substrate 2 such as a metal plate, and the precursor 3' of the mold 3 obtained in FIG. 2C is superimposed thereon with the recess 3b positioned on the lower side, as shown in FIGS. 4A to 4C. A conductive film 1 is formed by drying the conductive paste 1', and curing, when a binding agent is curable resin, the binding agent, and the precursor 3' is fixed on the conductive substrate 2 and is then polished to penetrate through the recess 3b, thereby making it possible to manufacture the same mold for electroforming EM.

In the mold for electroforming EM manufactured by the steps, the whole surface at the bottom of the through-hole pattern 3a is covered with the conductive film 1 having superior properties, as described above, thereby making it possible to produce a fine metal component having good properties without removing the conductive film 1.

The mold for electroforming EM may be manufactured by applying the conductive paste to the lower surface of the mold 3, followed by drying with the conductive paste superimposed on the conductive substrate 2, and curing, when the binding agent is curable resin, the binding agent, which is not illustrated. Alternatively, the mold for electroforming EM may be manufactured by applying the conductive paste to the lower surface of the precursor 3' with the recess 3b positioned on the lower side, followed by drying with the conductive paste superimposed on the conductive substrate 2, curing, when the binding agent is curable resin, the binding agent, and polishing the precursor 3' to penetrate through the recess 3b, which is not similarly illustrated.

In these cases, there occurs a state where the conductive substrate 2 is basically exposed at the bottom of the through-hole pattern 3a, as previously described, and the conductive film composed of the conductive paste which has protruded is formed particularly in a part of the peripheral edge of the through-hole pattern 3a. However, the conductive film has superior properties, as described above, so that it need not be removed. In this case, therefore, a fine metal component having good properties can be also produced without removing the conductive film.

Suitably used as the conductive paste 1' which is the original form of the conductive film 1 is one which respectively contains a chain-shaped metal powder and a binding agent as solid contents and in which the ratio of the chain-shaped metal powder to the total amount of the solid contents is adjusted to 0.05 to 20% by volume. The reason for this is as described above.

Examples of the chain-shaped metal powder and the binding agent are the same ones as described above.

It is preferable that the coating thickness of the conductive paste 1' is 0.5 to 70 μm.

In a case where the coating thickness is less than 0.5 μm, the effect of fixing the mold 3 on the conductive substrate 2 with the conductive paste cannot be sufficiently obtained, and the mold is easily shifted, for example, at the time of electroplating, so that the shape reproducibility of the fine metal component may be lowered.

Conversely, in a case where the coating thickness exceeds 70 μm, when the mold 3 is superimposed on the conductive substrate 2, the excessive conductive paste extruded by a stress created in the case of the superimposition, the weight of the mold 3, and so on protrude in large amounts into the through-hole pattern 3a to wave and rise in a droplet shape, resulting in possibilities that a plating starting surface is irregular in shape so that a plated coating having a uniform crystal structure cannot be formed, and the plated coating is thinned by the amount of the rise of the conductive paste, so that the fine metal component having a predetermined thickness cannot be produced.

Examples of the conductive substrate 2 include a substrate made of a metal such as a stainless steel, Al, Cu or these alloy, or a complex formed by laminating conductive layers on a nonconductive substrate made of Si, glass, ceramics, plastic, or the like. Conductive layers composed of the same type or another type of metal can be also laminated by the sputtering method or the like, as required, on the substrate made of the metal or the alloy.

Suitably used as an insulating material forming the mold 3 is resin capable of injection molding, reactive injection molding, or the like, as described above. Examples of such resin include polymethyl methacrylate, polypropylene, polycarbonate, and epoxy resin.

Figure 5A:
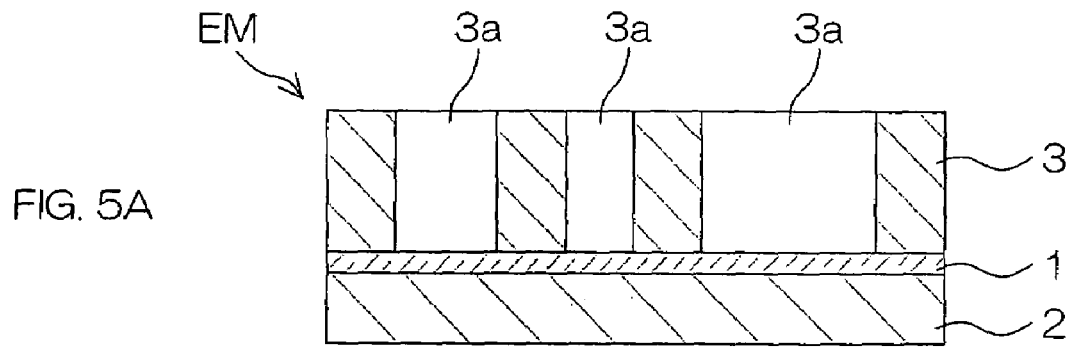
FIGS. 5A to 5D are cross-sectional views showing an example of the steps of producing a fine metal component by a production method according to the present invention using the above-mentioned mold for electroforming.

In the present invention, on a surface of the conductive film 1 exposed at portions of the through-hole pattern 3a, as shown in FIG. 5A, or a surface of the conductive substrate 2 exposed at portions of the through-hole pattern 3a and a surface of the conductive film 1 composed of the conductive paste which has protruded thereinto, which are not illustrated, of the mold for electroforming EM manufactured in the above-mentioned manner, a plated coating is made to selectively grow by electroplating using the portions as electrodes.

That is, the conductive film 1 and/or the conductive substrate 2 as a cathode and a metal to be plated or platinum or the like as an anode are dipped in an electroplating bath, followed by application of a voltage, to make a plated coating grow. Consequently, a plated coating 4' which is the original form of the fine metal component, corresponding to the shape of the through-hole pattern 3a, having a uniform crystal structure throughout, as described above, is formed (FIG. 5B).

Figure 5B:
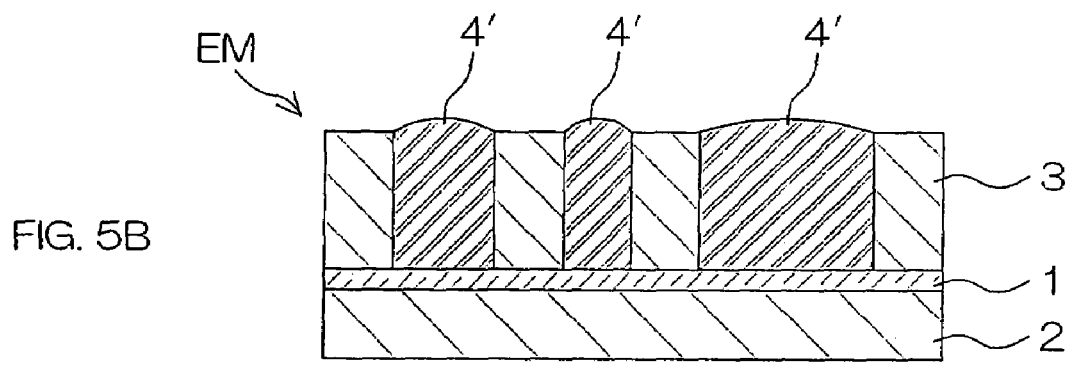
Figure 5C:
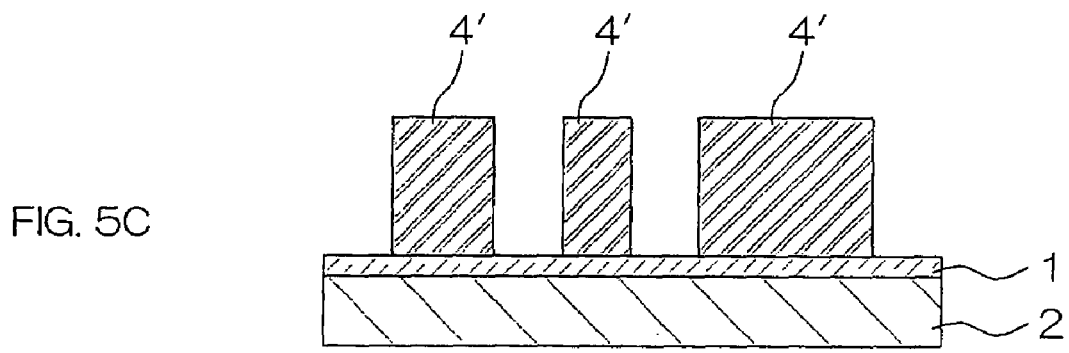

After the formed plated coating 4', together with the mold 3, is then polished or ground, for example, to line up the plated coating 4' and the mold 3 with each other to a predetermined thickness, the mold 3 is removed (FIG. 5C).

Preferable as a method of removing the mold 3 is a method performed by non-contact such as ashing using oxygen plasma, or decomposition by irradiation with X-rays or ultraviolet rays, for example, in order not to deform the plated coating 4' by application of an excessive stress.

Figure 5D:
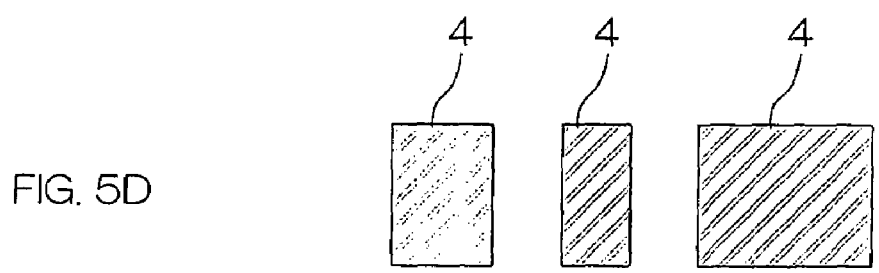

Finally, when the conductive film 1 and the conductive substrate 2 are removed, a fine metal component 4 is completed (FIG. 5D).

Preferable as a method of removing the conductive film 1 and the conductive substrate 2 is a method of dissolving the conductive film 1 using a suitable solvent or decomposing and removing the conductive film 1 by dry etching or the like. Consequently, the remaining conductive substrate 2 maybe removed after the conductive film 1 is made to disappear.

<Production Method (ii) for Fine Metal Component>

In a production method (ii) for a fine metal component in the present invention, a mold for electroforming EM, having such a form that a mold 3 composed of an insulating material is fixed, having a fine through-hole pattern 3a corresponding to the shape of the fine metal component, on a conductive substrate 2 with a conductive film 1 intervened between the conductive substrate and the mold is manufactured, as shown in FIG. 5A, in the same manner as the production method (i) except that a conductive paste containing a chain-shaped metal powder and a granular metal powder having a smaller particle diameter than that of the chain-shaped metal powder is used.

The specific steps are the same as those in the case of the production method (i).

Specifically, the mold for electroforming EM is manufactured by any of the following methods:

(A) A method of applying a conductive paste 1' over the whole surface of the conductive substrate 2, then superimposing the mold 3 thereon, and drying, solidifying, or curing the conductive paste 1', to form the conductive film 1 as well as to fix the mold 3 on the conductive substrate 2, as shown in FIGS. 3A and 3B.

(B) A method of applying a conductive paste to the lower surface of the mold 3, and then drying, solidifying, or curing the conductive paste in a state where the conductive paste is superimposed on the conductive substrate 2, to fix the mold 3 on the conductive substrate 2, which is not illustrated.

(C) A method of applying a conductive paste 1' over the whole surface of the conductive substrate 2, then superimposing a precursor 3' of the mold 3 thereon with a recess 3b positioned on the lower side, and drying, solidifying, or curing the conductive paste, to join, fix, and then polish the precursor 3' to penetrate through the recess 3b, as shown in FIGS. 4A and 4C.

(D) A method of applying a conductive paste to the lower surface of a precursor 3' with a recess 3b positioned on the lower side, and drying, solidifying, or curing the conductive paste in a state where the conductive paste is superimposed on the conductive substrate 2, to join, fix, and then polish the precursor 3' to penetrate through the recess 3b, which is not illustrated.

In the case of the methods (A) and (C), there occurs a state where in the mold for electroforming EM, the whole surface at the bottom of the through-hole pattern 3a is covered with the conductive film 1. On the other hand, in the case of the methods (B) and (D), there occurs a state where the conductive substrate 2 is basically exposed at the bottom of the through-hole pattern 3a, and the conductive film composed of the conductive paste which has protruded is formed particularly in a part of a peripheral edge of the through-hole pattern 3a.

In either one of the states, the conductive film 1 has a good conductivity obtained by the properties of the chain-shaped metal powder, and the distribution density of power feeding points can be increased by the function of the granular metal powder added thereto.

Therefore, the fine metal component 4 having good properties can be produced by subsequently carrying out the steps shown in FIGS. 5B to 5D.

It is preferable that the coating thickness of the conductive paste 1' which is the original form of the conductive film 1 is 0.5 to 70 μm for the same reason as described above.

Suitably used as the conductive paste 1' is one which respectively contains a chain-shaped metal powder and a granular metal powder as solid contents and in which the content of the chain-shaped metal powder in the total amount of the solid contents is 0.05 to 20% by volume, and the content of the granular metal powder therein is 0.05 to 20% by volume. The reason for this is as described above.

Usable as the chain-shaped metal powder and the binding agent are the same ones as described above.

The granular metal powder can be produced by the reduction and deposition method, as in the foregoing.

If a metal powder is produced by a metal having no paramagnetism such as Ag, Cu, Al, Au, or Rh which is not linked in a chain shape by the above-mentioned mechanism when the reduction and deposition method is carried out, the metal powder itself presents a granular shape.

If the pH of the reducing agent solution is set to not more than 7 to carry out the reduction and deposition method, a metal powder composed of a metal having paramagnetism can be prevented from being formed in a chain shape and therefore, can be formed in a granular shape. That is, when the pH is set to not more than 7 to carry out the reduction and deposition method, the growth speed of the metal is restrained. Accordingly, a metal powder having a single-crystal structure which is easily formed in a chain shape can be prevented from being produced in large amounts in a solution in the early stages of reaction. Therefore, the metal powder composed of the metal having paramagnetism can be formed in a granular shape.

Moreover, in the granular metal powder formed by the reduction and deposition method, the particle sizes of grains are uniform, and the particle size distribution is sharp. The reason for this is that reduction reaction uniformly progresses in the reaction system. According to such a metal powder, therefore, the conductivity of the conductive film can be made more uniform, thereby making it possible to produce a fine metal component having better properties.

When the metal powder is a Cu powder, it is preferable that the Cu powder is formed by reducing the pH of a solution containing Cu(I) ammine complex ions to deposit a metal Cu in the shape of ultrafine particles.

This method utilizes the fact that a Cu(I) ammine complex which is stable in a state where a solution is basic is destabilized when the solution is made acidic, so that Cu(I) ions ($Cu^{1+}$) in the complex is disproportionated and decomposed into Cu(II) ions ($Cu^{2+}$) and a metal Cu (Cu) and as a consequence, the metal Cu is deposited in the solution.

According to this method, the Cu powder can be produced more safely without using both hydrazine and a hydrazine compound which are dangerous objects, which are used as a reducing agent in the reduction and deposition method. Consequently, the necessity of production facilities, storage facilities, and so on which are subjected to strict safety management is eliminated.

Although a solution containing Cu(I) ammine complex ions is produced by adding a metal Cu to a solution containing Cu(II) sulfate, ammonia, and ammonia sulfate, for example, followed by reaction under oxygen-free conditions, a solution containing Cu(II) ions obtained after the metal Cu is deposited to obtain a Cu powder in the subsequent step can be reused as a starting raw material in producing a solution containing Cu(I) ammine complex ions again. That is, the solution can be used almost semipermanently.

Consequently, the production cost of the Cu powder can be made lower than before.

In all the steps from the step of preparing the solution containing Cu(I) ammine complex ions, to the step of depositing the metal Cu to produce the Cu powder, described above, a component containing an element which may be eutectoid with Cu, such as phosphate, need not be added. Moreover, the higher the deposition rate of the metal Cu is made by adjusting the conditions of disproportionation and decomposition reaction, the more greatly the amount of mixing of impurities can be reduced.

Even if a low-purity and low-cost metal Cu, such as recycle Cu, is used for preparing the solution containing Cu(I) ammine complex ions, for example, therefore, the Cu powder can be maintained at high purity.

The above-mentioned disproportionation and decomposition reaction is performed under agitation, for example, so that the deposition of the metal Cu can be almost uniformly conducted in the solution. In the produced Cu powder, therefore, the particle diameters of a plurality of particles forming the produced Cu powder are almost uniform.

Moreover, when the disproportionation and decomposition reaction is performed under agitation, the metal Cu can be prevented from being selectively deposited in only a particular portion of each of the particles to average the growth of the particles throughout all directions. In the produced Cu powder, therefore, the shape thereof is an almost uniform spherical shape.

If the above-mentioned Cu powder is used, therefore, the conductivity of the conductive film is further made uniform, and the smoothness of its surface can be further improved. Therefore, a fine metal component having better properties can be produced.

<Production Method (iii) for Fine Metal Component>

Figure 6A:
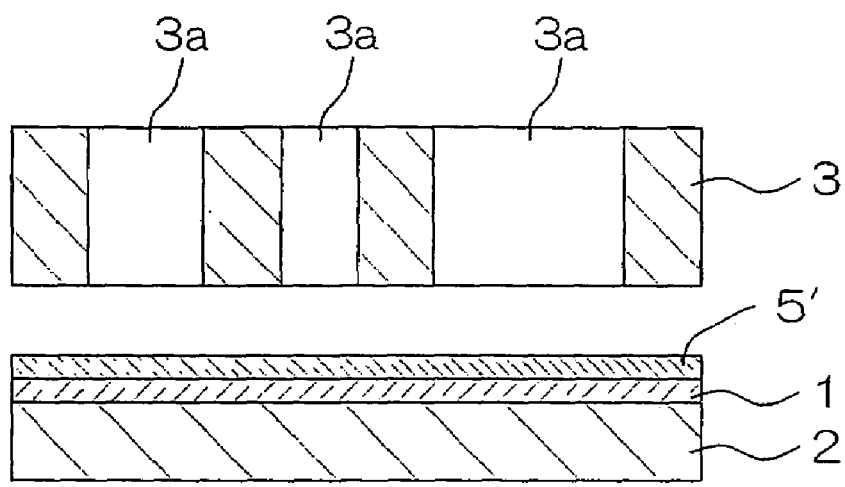
FIGS. 6A and 6B are cross-sectional views showing still another example of the steps of forming a mold for electroforming using the above-mentioned mold.
Figure 6B:
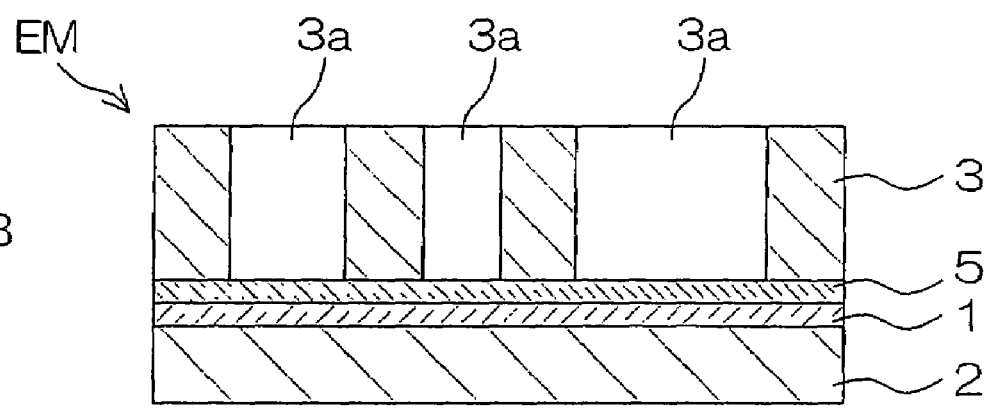

In a production method (iii) for a fine metal component according to the present invention, a conductive paste is applied over the whole surface of a conductive substrate 2 to form a first conductive film 1, and a conductive paste 5' containing a metal powder having a smaller particle diameter than that of a chain-shaped metal powder contained in the first conductive film 1 is applied thereon, as shown in FIG. 6A, and a mold 3 is then superimposed thereon, as shown in FIG. 6B.

A mold for electroforming EM is manufactured by drying the conductive paste 5' and curing, when a binding agent is curable resin, the binding agent to form a second conductive film 5 as well as to fix the mold 3 on the conductive substrate 2.

Figure 7A:
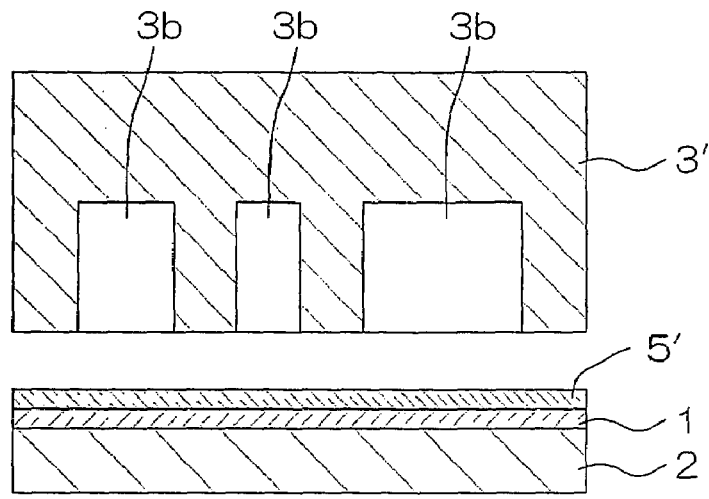
FIGS. 7A to 7C are cross-sectional views showing a further example of the steps of forming a mold for electroforming using the above-mentioned mold.
Figure 7B:
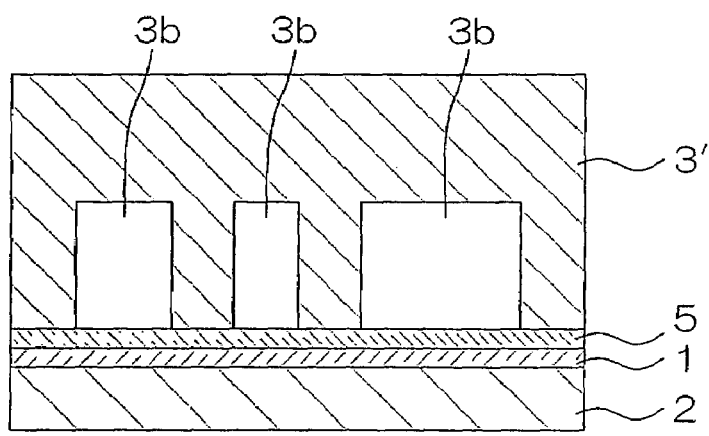
Figure 7C:
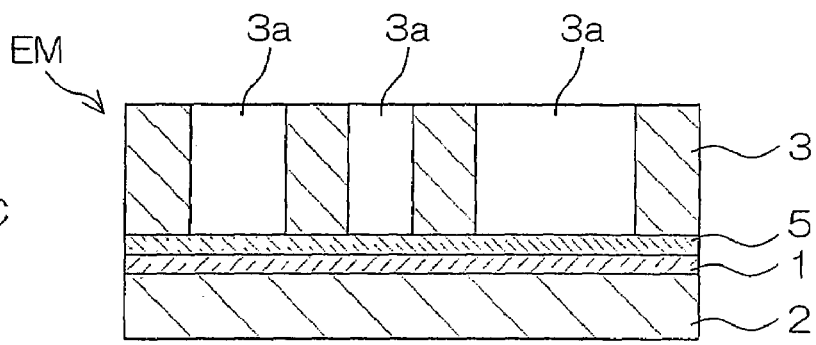

Alternatively, the mold for electroforming EM may be manufactured by applying the above-mentioned conductive paste 5' over the first conductive film 1, then superimposing a precursor 3' of a mold 3 thereon with a recess 3b positioned on the lower side, drying, solidifying, or curing the conductive paste 5' to form a second conductive film 5 as well as to join and fix the precursor 3', and then polishing the precursor 3' to penetrate through the recess 3b, as shown in FIGS. 7A to 7C.

In either one of the cases, in the mold for electroforming EM, the whole surface at the bottom of a through-hole pattern 3a is covered with the second conductive film.

Even if the distribution density of power feeding points at the start of electroplating is insufficient on the surface of the first conductive film 1, therefore, clearances there among are filled with the metal powder in the second conductive film, thereby making it possible to increase the distribution density of the power feeding points.

Therefore, the steps shown in FIGS. 5A to 5D are subsequently carried out, thereby making it possible to produce a fine metal component 4 having good properties.

Usable as a conductive paste 1' which is the original form of the first conductive film 1 is the same one as that used in the production method (i).

It is preferable that the coating thickness of the conductive paste 1' is 0.5 to 70 μm for the same reason as described above.

On the other hand, it is preferable that the coating thickness of the conductive paste 5' which is the original form of the second conductive film 5 is 0.5 to 70 μm.

In a case where the coating thickness is less than 0.5 μm, the effect of fixing the mold 3 on the conductive substrate 2 with the conductive paste 5' cannot be sufficiently obtained, and the mold may be shifted at the time of electroplating, so that the shape reproducibility of the fine metal component may be lowered.

Conversely, in a case where the coating thickness exceeds 70 μm, when the mold 3 is superimposed on the conductive substrate 2, the excessive conductive paste extruded by a stress created in the case of the superimposition, the weight of the mold 3, or the like protrudes in large amounts into the through-hole pattern 3a to wave and rise in a droplet shape, resulting in possibilities that a plating starting surface becomes irregular in shape so that a plated coating having a uniform crystal structure cannot be formed, and the plated coating is thinned by the amount of the rise of the conductive paste so that a fine metal component having a predetermined thickness cannot be produced.

Suitably used as the conductive paste 5' which is the original form of the second conductive film 5 is one which respectively contains a metal powder having a smaller particle diameter than that of chain-shaped metal powder included in the first conductive film 1 and a binding agent as solid contents and in which the ratio of the metal powder to the total amount of the solid contents is adjusted to 0.05 to 70% by volume. The reason for this is as described above.

Usable as the binding agent is the same one as described above.

Although the range of the particle diameter of the metal powder is not particularly limited, provided that the particle diameter is smaller than that of the chain-shaped metal powder included in the first conductive film, the average particle diameter is preferably not more than 400 nm. When the average particle diameter is not more than 400 nm, the number of contact points among metal particles forming the metal powder can be increased by raising the bulk density. Accordingly, the effect of increasing the distribution density of power feeding points by the metal powder in the second conductive film can be further improved.

Usable as the metal powder are metal powders composed of Ag, Cu, Ni, Al, Au, Rh, etc. and having various types of shapes such as a chain shape, a granular shape, and a foil shape having a smaller particle diameter than that of the chain-shaped metal powder included in the first conductive film.

The chain-shaped metal powder out of the metal powders can be produced in the same manner as described above.

The granular metal powder can be also produced in the same manner as described above.

Preferably used as the granular metal powder is one formed by reducing the pH of the solution containing Cu(I) ammine complex ions, previously described to deposit the metal Cu in the shape of ultrafine particles. If such a Cu powder is used, the conductivity of the second conductive film is made more uniform, and the smoothness of its surface can be further improved, thereby making it possible to produce a fine metal component having better properties.

Any of the fine metal components produced in the production methods (i) to (iii) has a single layered structure capable of exhibiting desired physical, mechanical, and electrical properties because the grains are of the original particle sizes, as previously described, and has good properties.

Examples of such a fine metal component are a contact probe used for a semiconductor inspection device or the like, a micro actuator used for an acceleration sensor or the like, a light switch, and a micro connector, etc.

INDUSTRIAL APPLICABILITY

As described in the foregoing, the conductive paste according to the present invention is useful as a material for forming a conductive film, conductive adhesives, etc. because the electrical resistance of the conductive film can be made lower than that at the current level. Further, the conductive film according to the present invention can be used in applications which have not been so far considered because it has a unique anisotropic conductivity. The plating method according to the present invention and the production method for a fine metal component to which the plating method is applied are suitable for the production of a fine metal component having good properties which have not been so far considered.

EXAMPLES

The present invention will be described on the basis examples and comparative examples.

Example 1

<Production of Chain-shaped Ni Powder>

Titanium trichloride and sodium citrate were added to pure water, to prepare a reducing agent solution in which the concentrations of both the components take values shown in the following Table 1:

TABLE 1

| Component | Concentration (mol/L) |
| --- | --- |
| Titanium trichloride | 0.102 |
| Sodium citrate | 0.306 |

Ammonia water was then added to the reducing agent solution, to adjust the pH of the reducing agent solution to 9 to 10 while maintaining the liquid temperature thereof at 35° C.

Furthermore, a nickel chloride hexahydrate was added to the pure water, to prepare a solution in which the concentration of nickel chloride is 0.04 mol/L.

After 100 ml of the solution was added to 100 ml of the reducing agent solution, previously described, followed by agitation at a temperature of 35° C. for one hour, a solid content deposited in the solution was filtered, rinsed, and then dried, to produce a Ni powder.

Figure 8:
FIG. 8 is an electron micrograph showing the structure of particles forming a chain-shaped Ni powder produced in an example 1 of the present invention.

When the shape of the obtained Ni powder was observed using a scanning-type electron microphotograph, it was confirmed that the Ni powder had the form of fine metal particles being linked in a chain shape, as shown in FIG. 8.

When the particle diameter of each of the metal particles and the diameter of the chain of the Ni powder were measured from the above-mentioned electron microphotograph, the particle diameter of each of the metal particles was approximately 100 nm, and the diameter of the chain was approximately 200 nm.

<Preparation of Conductive Paste>

90 parts by weight of the chain-shaped Ni powder produced in the foregoing and 10 parts by weight of poly(vinylidene fluoride) serving as a binding agent, together with N-methyl-2-pyrrolidone serving as a solvent, were mixed, to prepare a conductive paste.

<Formation of Conductive Film>

The conductive paste prepared in the foregoing was applied to one surface of a polyimide film serving as a base such that the amount of adhesion of the solid content would be 20 mg/cm$^2$, and was then dried at 100° C. for four hours to remove the solvent, thereby forming a conductive film.

When the surface of the conductive film was observed by a metal microscope, it was confirmed that there were few irregularities on the surface so that the surface was nearly flat. The state of the surface was estimated to be good. When the volume resistivity of the conductive film was measured, it was $1\times10^{-4}$ Ω·cm.

<Formation of Plated Coating>

A conductive terminal was then attached to the conductive film to serve as a power feeding portion, and the conductive film was dipped in a Ni plating bath prescribed as shown in the following Table 2, to perform electroplating for one hour under conditions of a current density of 10 to 150 mA/cm$^2$ and a liquid temperature of 40 to 60° C.

TABLE 2

| Ni plating bath (pH3.5~4.5) | |
| --- | --- |
| Component | Concentration |
| Nickel sulfamate | 450 g/L |
| Boric acid | 30 g/L |

After electroplating, the cross section of the plated coating formed on the conductive film was observed using the metal microscope, to measure the sizes of grains at positions 5% above and below the cross section of the plated coating along its thickness. When the ratio $R_\sigma$ of the sizes of the grains was found by the following equation (1) from the sizes $\varnothing_1$ of the grains on the side of the conductive film and the sizes $\varnothing_2$ of the grains on the side of the surface of the plated coating, it was 1.1:

$$R_\sigma = \varnothing_1/\varnothing_2 \qquad (1)$$

Accordingly, the sizes of the grains hardly varied. It was confirmed that the plated coating had a uniform crystal structure throughout the thickness thereof.

Example 2

<Production of Chain-shaped Permalloy Powder>

A nickel chloride hyxahydrate and ferric chloride were added to pure water, to prepare a solution in which the concentrations of both the components take values shown in the following Table 3:

TABLE 3

| Component | Concentration (mol/L) |
| --- | --- |
| Nickel chloride | 0.008 |
| Ferric chloride | 0.032 |

After 100 ml of the solution was then added to 100 ml of the same reducing agent solution as that used in the example 1, followed by agitation at a temperature of 35° C. for one hour, a solid content deposited in the solution was filtered, rinsed, and then dried, to produce a Permalloy [Ni (20%)—Fe alloy] powder.

Figure 9:
FIG. 9 is an electron micrograph showing the structure of particles forming a chain-shaped Permalloy powder produced in an example 2 of the present invention.

When the shape of the obtained Permalloy powder was observed using a scanning-type electron microphotograph, it was confirmed that the Permalloy powder had the form of fine metal particles being linked in a chain shape, as shown in FIG. 9.

When the particle diameter of each of the metal particles and the diameter of the chain of the Permalloy powder were measured from the electron microphotograph, the particle diameter of each of the metal particles was approximately 50 nm, and the diameter of the chain was approximately 100 nm.

<Preparation of Conductive Paste>

90 parts by weight of the chain-shaped Permalloy powder produced in the foregoing and 10 parts by weight of poly(vinylidene fluoride) serving as a binding agent, together with N-methyl-2-pyrrolidone serving as a solvent, were mixed, to prepare a conductive paste.

<Formation of Conductive Film>

A conductive film was formed on one surface of a polyimide film serving as a base in the same manner as that in the example 1 except that the above-mentioned conductive paste was used.

When the surface of the conductive film was observed by a metal microscope, it was confirmed that there were no irregularities on the surface so that the surface was flat. The state of the surface was estimated to be good. When the volume resistivity of the conductive film was measured, it was $2\times10^{-4}$ Ω·cm.

<Formation of Plated Coating>

When Ni was then electroplated in the same manner as that in the example 1 except that the conductive film was used, and the cross section of a plated coating formed on the conductive film was then observed by the metal microscope, to find the ratio $R_\sigma$ of the sizes of grains, it was 0.9 by the foregoing equation (1). Accordingly, the sizes of the grains hardly varied. It was confirmed that the plated coating had a uniform crystal structure throughout the thickness thereof.

Example 3

<Formation of Conductive Film>

The same conductive paste as that prepared in the example 1 was applied to one surface of a polyimide film serving as a base such that the amount of adhesion of a solid content would be 20 mg/cm², was then dried at 100° C. for four hours to remove a solvent while applying to a coating film a magnetic field having a strength of 79 A/m along its plane, thereby forming a conductive film.

In the conductive film, a chain-shaped Ni powder was oriented in the direction of the above-mentioned magnetic field, and was high in the conductivity in only the direction of the orientation in its plain. That is, the volume resistivity in the direction in which the chain-shaped Ni powder was oriented in the plane of the conductive film presented a low value of $5 \times 10^{-5}$ Ω·cm, while the volume resistivity in a direction perpendicular to the direction of the orientation in the same plane was $3 \times 10^{-3}$ Ω·cm, and the volume resistivity in the direction of the thickness of the conductive film was $2.5 \times 10^{-3}$ Ω·cm.

When the surface of the conductive film was observed by a metal microscope, it was confirmed that there were no irregularities on the surface so that the surface was flat. The state of the surface was estimated to be good.

<Formation of Plated Coating>

After Ni was then electroplated in the same manner as that in the example 1 except that a conductive terminal was attached to a portion at an end in the direction of the orientation of the conductive film to serve as a power feeding portion, the cross section of a plated coating formed on the conductive film was observed by the metal microscope, to find the ratio $R_\sigma$ of the sizes of grains, it was 1.1 by the foregoing equation (1). Accordingly, the sizes of the grains hardly varied. It was confirmed that the plated coating had a uniform crystal structure throughout the thickness thereof.

Comparative Example 1

<Preparation of Conductive Paste>

90 parts by weight of a spherical Ni powder having an average particle diameter of 1.2 μm and 10 parts by weight of poly (vinylidene fluoride) serving as a binding agent, together with N-methyl-2-pyrrolidone serving as a solvent, were mixed, to prepare a conductive paste.

<Formation of Conductive Film>

A conductive film was formed on one surface of a polyimide film serving as a base in the same manner as that in the example 1 except that the above-mentioned conductive paste was used.

When the surface of the conductive film was observed by a metal microscope, it was confirmed that there were non-uniform irregularities corresponding to the size of the Ni powder on the surface so that the surface was not flat. The state of the surface was estimated to be bad. When the volume resistivity of the conductive film was measured, it was $8 \times 10^{-4}$ Ω·cm.

<Formation of Plated Coating>

When Ni was then electroplated in the same manner as that in the example 1 except that the conductive film was used, and the cross section of a plated coating formed on the conductive film was then observed by the metal microscope, to find the ratio $R_\sigma$ of the sizes of grains, it was 3.0 by the foregoing equation (1). Accordingly, the sizes of the grains widely varied. It was confirmed that the plated coating had a two-layered structure comprising an area where the metal grains were large and an area where they were small.

Comparative Example 2

<Preparation of Conductive Paste>

90 parts by weight of a spherical Ag powder having an average particle diameter of 1.2 μm and 10 parts by weight of poly (vinylidene fluoride) resin serving as a binding agent, together with N-methyl-2-pyrrolidone serving as a solvent, were mixed, to prepare a conductive paste.

<Formation of Conductive Film>

A conductive film was formed on one surface of a polyimide film serving as a base in the same manner as that in the example except that the above-mentioned conductive paste was used.

When the surface of the conductive film was observed by the metal microscope, it was confirmed that there were non-uniform irregularities corresponding to the size of an Ag powder on the surface so that the surface was not flat. The state of the surface was estimated to be bad. When the volume resistivity of the conductive film was measured, it was $1 \times 10^{-5}$ Ω·cm.

<Formation of Plated Coating>

When Ni was then electroplated in the same manner as that in the example 1 except that the conductive film was used, and the cross section of a plated coating formed on the conductive film was then observed by the metal microscope, to find the ratio $R_\sigma$ of the sizes of grains, it was 2.0 by the foregoing equation (1). Accordingly, the sizes of the grains widely varied. It was confirmed that the plated coating had a two-layered structure comprising an area where the metal grains were large and an area where they were small.

The foregoing results are summarized in Table 4:

TABLE 4

|  | Surface conditions of conductive film | Volume resistivity of conductive film | $R_\sigma$ |
|---|---|---|---|
| Example 1 | Good | $1 \times 10^{-4}$ | 1.1 |
| Example 2 | Very good | $2 \times 10^{-4}$ | 0.9 |
| Example 3 | Very good | $5 \times 10^{-5}$ | 1.1 |
| Comparative Example 1 | Bad | $8 \times 10^{-4}$ | 3.0 |
| Comparative Example 2 | Bad | $1 \times 10^{-5}$ | 2.0 |

Example 4

<Preparation of Conductive Paste>

20 parts by weight of a chain-shaped Ni powder produced in the example 1 and 80 parts by weight of thermosetting acrylic syrup which is liquid curable resin were mixed, to prepare a conductive paste. The ratio of the chain-shaped Ni powder to the total amount of both the components was 2.5% by volume.

<Preparation of Mold for Electroforming>

A mother die IM1 which is the original form of a fine metal component was formed on a conductive substrate IM2, as shown in FIG. 2A, utilizing X-ray lithography and electroplating.

Light curable resin [trade name XNR5507 manufactured by NAGASE&CO., LTD.] was then photo-cured after formation by reactive injection molding using the mother die IM1, to obtain a precursor 3' of a mold 3 having a fine recess 3b which was the original form of a through-hole pattern 3a corresponding to the shape of the mother die IM1 [FIGS. 2B and 2C]. The conditions of photo-curing were an exposure dose of 3 J/cm$^2$ and a pressure of 0.1 MPa.

After a conductive paste 1' previously prepared was then applied over a Cu substrate serving as a conductive substrate 2 such that the thickness thereof would be 5 µm using a blade coater, as shown in FIG. 4A, the precursor 3' was superimposed thereon with the recess 3b positioned on the lower side, and was then heated at 80° C. for two hours while being pressed at a pressure of 0.1 MPa, to cure the thermosetting acrylic syrup in the conductive paste 1', thereby forming a conductive film 1 as well as fixing the precursor 3' on the conductive substrate 2 (FIG. 4B).

The fixed precursor 3' was polished until the thickness thereof reached 150 µm to penetrate through the recess 3b, thereby manufacturing a mold for electroforming EM shown in FIG. 4C comprising the mold 3 having the through-hole pattern 3a corresponding to the shape of the mother die IM1.

The fixing with the conductive paste was strong, so that the conductive substrate 2 and the mold 3 were neither shifted nor peeled off, for example, even when the precursor 3' was polished, as described above.

<Production of Fine Metal Component>

A conductive terminal was attached to the conductive substrate 2 in the above-mentioned mold for electroforming EM, to serve as a power feeding portion, and the mold for electroforming EM was dipped in a Ni plating bath prescribed as described below, to perform electroplating under conditions of a current density of 10 to 150 mA/cm$^2$ and a liquid temperature of 40 to 60° C.

TABLE 5

| Ni plating bath (pH3.5~4.5) | |
|---|---|
| Component | Concentration |
| Nickel sulfamate | 450 g/L |
| Boric acid | 30 g/L |

When the above-mentioned electroplating was performed for two hours, the through-hole pattern 3a in the mold for electroforming EM was filled with a plated coating 4', as shown in FIG. 5B. After the mold for electroforming EM was taken out of the plating bath, and was sufficiently rinsed, therefore, the plated coating 4', together with the mold 3, was polished, to line up the plated coating 4' and the mold 3 with each other to a thickness of 60 µm.

After the mold 3 was decomposed and removed by ashing using an oxygen plasma, the conductive film 1 was dissolved and removed by wet etching to remove the conductive substrate 2, thereby producing a fine metal component 4 corresponding to the shape of the above-mentioned mother die IM1.

When the surface roughness of the surface on the side of the conductive film 1 of the produced fine metal component 4 was measured using a 3D Surface Profiler [New-View5010™ manufactured by ZYGO Corporation], the center line average surface roughness Ra was less than 0.5 µm.

When the tensile strength of the produced fine metal component 4 was measured, to find the percentage of its measured value to the tensile strength of a fine metal component of the same size directly formed by electroplating under the same conditions on the flat Cu substrate as a strength ratio, it was 90%.

From the foregoing, it was confirmed that the fine metal component 4 produced in the example 4 had good properties comprising a single layered structure capable of exhibiting desired physical, mechanical, and electrical properties because grains of the original particle sizes which were identical to those in a case where it was made to grow on a flat metal surface are produced from the early stages of film formation, and had a uniform crystal structure throughout.

Example 5

<Preparation of Conductive Paste>

20 parts by weight of a chain-shaped Ni powder produced in the example 1, 20 parts by weight of a spherical Ag powder having an average particle diameter of 50 nm, and 60 parts by weight of thermosetting acrylic syrup which is liquid curable resin were mixed, to prepare a conductive paste. The ratio of the chain-shaped Ni powder to the total amount of the three components was 2.5% by volume, and the ratio of the spherical Ag powder thereto was 2% by volume.

<Preparation of Mold for Electroforming>

After a conductive paste 1' prepared as described above was then applied over a Cu substrate serving as a conductive substrate 2, as shown in FIG. 4A, a precursor 3' which was the same as that formed in the example 4 was superimposed thereon with a recess 3b positioned on the lower side, and was heated at 80° C. for two hours while being pressed at a pressure of 0.1 MPa to cure thermosetting acrylic syrup in the conductive paste, thereby forming a conductive film 1 as well as fixing the precursor 3' on the conductive substrate 2 (FIG. 4B).

The fixed precursor 3' was polished until the thickness thereof reached 150 µm to penetrate through the recess 3b, thereby manufacturing a mold for electroforming EM shown in FIG. 4C comprising a mold 3 having a through-hole pattern 3a corresponding to the shape of a mother die IM1.

The fixing with the conductive paste was strong, so that the conductive substrate 2 and the mold 3 were neither shifted nor peeled off, for example, even when the precursor 3' was polished, as described above.

Thereafter, a fine metal component 4 in the same shape and of the same size was produced in the same manner as that in the example 4 using the mold for electroforming EM.

When the surface roughness of the surface on the side of the conductive film 1 of the produced fine metal component 4 was measured in the same manner as described above, the center line average surface roughness Ra was less than 0.2 µm.

The tensile strength of the produced fine metal component 4 was measured, to find a strength ratio, as in the foregoing, it was 95%.

From the foregoing, it was confirmed that the fine metal component 4 produced in the example 5 had better properties than those in the example 4 comprising a single layered structure capable of exhibiting desired physical, mechanical, and electrical properties because grains of the original particle sizes which were identical to those in a case where it was made to grow on a flat metal surface were produced from the early stages of film formation, and had a uniform crystal structure throughout.

Example 6

<Preparation of Conductive Paste>

75 parts by weight of a spherical Ag powder having an average particle diameter of 50 nm and 25 parts by weight of thermosetting acrylic syrup which is liquid curable resin were mixed, to prepare a conductive paste which is the original form of a second conductive film. The ratio of the spherical Ag powder to the total amount of both the components was 20% by volume.

<Preparation of Mold for Electroforming>

A conductive paste containing a chain-shaped Ni powder which was the same as that prepared in the example 4 was applied over a Cu substrate serving as a conductive substrate 2 such that the thickness thereof would be 5 µm using a blade coater, as shown in FIG. 7A, and was then heated at 80° C. for two hours to cure thermosetting acrylic syrup in the conductive paste, thereby forming a first conductive film 1.

After a conductive paste 5' containing a spherical Ag powder prepared as described above was then applied over the first conductive film 1, a precursor 3' which was the same as that formed in the example 4 was superimposed thereon with a recess 3b positioned on the lower side, and was heated at 80° C. for two hours while being pressed at a pressure of 0.1 MPa to cure the thermosetting acrylic syrup in the conductive paste, thereby forming a second conductive film 5 as well as fixing the precursor 3' on the conductive substrate 2 (FIG. 7B).

The fixed precursor 3' was polished until the thickness thereof reached 150 µm to penetrate through the recess 3b, thereby manufacturing a mold for electroforming EM shown in FIG. 7C comprising a mold 3 having a through-hole pattern 3a corresponding to the shape of a mother die IM1.

The fixing with the conductive paste was strong, so that the conductive substrate 2 and the mold 3 were also neither shifted nor peeled off, for example, even when the precursor 3' was polished, as described above.

Thereafter, the fine metal component 4 in the same shape and of the same size was produced in the same manner as that in the example 4 using the mold for electroforming EM.

When the surface roughness of the surface on the side of the conductive film 1 of the produced fine metal component 4 was measured in the same manner as described above, the center line average surface roughness Ra was less than 0.2 µm.

The tensile strength of the produced fine metal component 4 was measured, to find a strength ratio in the same manner as described above, it was 95%.

From the foregoing, it was confirmed that the fine metal component 4 produced in the example 6 had better properties than those in the example 4 comprising a single layered structure capable of exhibiting desired physical, mechanical, and electrical properties because grains of the original particle sizes which were identical to those in a case where it was made to grow on a flat metal surface were produced from the early stages of film formation, and had a uniform crystal structure throughout.

Comparative Example 3

<Preparation of Conductive Paste>

20 parts by weight of a spherical Ni powder having an average particle diameter of 1.2 µm and 80 parts by weight of thermosetting acrylic syrup which is liquid curable resin were mixed, to prepare a conductive paste. The ratio of the spherical Ni powder to the total amount of both the components was 25% by volume.

<Preparation of Mold for Electroforming>

After a conductive paste 1' prepared in the foregoing was applied over a Cu substrate serving as a conductive substrate 2, as shown in FIG. 4A, a precursor 3' which was the same as that formed in the example 4 was superimposed thereon with a recess 3b positioned on the lower side, and was heated at 80° C. for two hours while being pressed at a pressure of 0.1 MPa, to cure thermosetting acrylic syrup in the conductive paste, thereby forming a conductive film 1 as well as fixing the precursor 3' on the conductive substrate 2 (FIG. 4B).

The fixed precursor 3' was polished until the thickness thereof reached 150 µm to penetrate through the recess 3b, thereby manufacturing a mold for electroforming EM shown in FIG. 4C comprising a mold 3 having a through-hole pattern 3a corresponding to the shape of a mother die IM1.

The fixing with the conductive paste was strong, so that the conductive substrate 2 and the mold 3 were also neither shifted nor peeled off, for example, even when the precursor 3' was polished, as described above.

Thereafter, an attempt to produce a fine metal component 4 in the same shape and of the same size was made in the same manner as that in the example 4 using the mold for electroforming EM. However, a continuous plated coating which can function as the fine metal component 4 was not formed until the thickness thereof reached the thickness of the mold 3 (150 µm).

Comparative Example 4

<Preparation of Conductive Paste>

75 parts by weight of a spherical Ni powder having an average particle diameter of 1.2 µm and 25 parts by weight of thermosetting acrylic syrup which is liquid curable resin were mixed, to prepare a conductive paste. The ratio of the spherical Ni powder to the total amount of both the components was 25% by volume.

<Preparation of Mold for Electroforming>

After a conductive paste prepared in the foregoing was applied over a Cu substrate serving as a conductive substrate 2, a precursor 3' which was the same as that formed in the example 4 was superimposed thereon with a recess 3b positioned on the lower side, and was heated at 80° C. for two hours while being pressed at a pressure of 0.1 MPa, to cure the thermosetting acrylic syrup in the conductive paste. However, it was impossible to fix the precursor 3' on the conductive substrate 2.

The foregoing results were summarized in Table 6:

TABLE 6

|  | Fixing of precursor | Ra (μm) | Strength Ratio (%) |
|---|---|---|---|
| Example 4 | Good | <0.5 | 90 |
| Example 5 | Good | <0.2 | 95 |
| Example 6 | Good | <0.2 | 95 |
| Comparative Example 3 | Good | — | — |
| Comparative Example 4 | Bad | — | — |

The invention claimed is:

1. A production method for a fine metal component, characterized by comprising the steps of:

fixing a mold composed of an insulating material having a fine through-hole pattern corresponding to the shape of a fine metal component on a conductive substrate with a conductive film composed of a conductive paste, characterized in that a metal powder having the form of a lot of fine metal particles including a metal selected from the group consisting of Ni, Fe, Co, and alloys of not less than two of Ni, Fe, and Co being linked in a chain shape by magnetism is contained as a conductive component, intervened between the conductive substrate and the mold to form a mold for electroforming; and making a plated coating selectively grow on a surface of the conductive substrate or the conductive film exposed at a portion of the through-hole pattern of the mold for electroforming by electroplating using the surface as an electrode, to form a fine metal product corresponding to the shape of the through-hole pattern.

2. The production method for a fine metal component according to claim 1, characterized in that used as the conductive paste is one which respectively contains a chain-shaped metal powder and a binding agent as solid contents and in which the content of the chain-shaped metal powder in the total amount of the solid contents is 0.05 to 20% by volume.

3. The production method for a fine metal component according to claim 1, characterized in that used as the conductive paste is one containing the chain-shaped metal powder as well as a granular metal powder having a smaller particle diameter than the chain-shaped metal powder.

4. The production method for a fine metal component according to claim 3, characterized in that used as the conductive paste is one which respectively contains the chain-shaped metal powder, a granular metal powder, and a binding agent as solid contents and in which the content of the chain-shaped metal powder in the total amount of the solid contents is 0.05 to 20% by volume and the content of the granular metal powder therein is 0.05 to 20% by volume.

5. A production method for a fine metal component, characterized by comprising the steps of:

forming on a conductive substrate a first conductive film composed of the conductive paste, characterized in that a metal powder having the form of a lot of fine metal particles including a metal selected from the group consisting of Ni, Fe, Co, and alloys of not less than two of Ni, Fe, and Co being linked in a chain shape by magnetism is contained as a conductive component, and a second conductive film composed of a conductive paste containing a metal powder having a smaller particle diameter than a chain-shaped metal powder contained in the first conductive film in this order, and fixing a mold composed of an insulating material having a fine through-hole pattern corresponding to the shape of a fine metal component on a conductive substrate with both the conductive films intervened between the conductive substrate and the mold, to form a mold for electroforming; and making a plated coating selectively grow on a surface of the second conductive film exposed at a portion of the through-hole pattern of the mold for electroforming by electroplating using the surface as an electrode, to form a fine metal component corresponding to the shape of the through-hole pattern.

6. The production method for a fine metal component according to claim 5, characterized in that used as the conductive paste for forming the second conductive film is one which respectively contains a metal powder and a binding agent as solid contents and in which the content of the metal powder in the total amount of the solid contents is 0.05 to 70% by volume.

* * * * *